United States Patent
Qi et al.

(10) Patent No.: US 11,293,101 B2
(45) Date of Patent: Apr. 5, 2022

(54) METHOD BASED ON MULTI-SOURCE DEPOSITION FOR FABRICATING PEROVSKITE FILM

(71) Applicant: OKINAWA INSTITUTE OF SCIENCE AND TECHNOLOGY SCHOOL CORPORATION, Okinawa (JP)

(72) Inventors: Yabing Qi, Kunigami-gun (JP); Luis Ono, Kunigami-gun (JP); Shenghao Wang, Kunigami-gun (JP)

(73) Assignee: OKINAWA INSTITUTE OF SCIENCE AND TECHNOLOGY SCHOOL CORPORATION, Kunigami-gun (JP)

( * ) Notice: Subject to any disclaimer, the term of this patent is extended or adjusted under 35 U.S.C. 154(b) by 364 days.

(21) Appl. No.: 16/357,837

(22) Filed: Mar. 19, 2019

(65) Prior Publication Data

US 2019/0211453 A1    Jul. 11, 2019

Related U.S. Application Data

(62) Division of application No. 15/502,331, filed as application No. PCT/JP2015/003450 on Jul. 8, 2015, now abandoned.
(Continued)

(51) Int. Cl.
*C23C 14/08* (2006.01)
*C23C 14/24* (2006.01)
(Continued)

(52) U.S. Cl.
CPC .......... *C23C 16/52* (2013.01); *C23C 14/0694* (2013.01); *C23C 14/12* (2013.01);
(Continued)

(58) Field of Classification Search
CPC ..... C23C 14/08; C23C 14/0694; C23C 14/24; C23C 14/243; C23C 14/505; C23C 14/542
See application file for complete search history.

(56) References Cited

U.S. PATENT DOCUMENTS 4,882,312 A * 11/1989 Mogro-Campero ......... C23C 14/087
                                                                       505/473
5,648,114 A    7/1997 Paz De Araujo et al.
(Continued)

FOREIGN PATENT DOCUMENTS

EP    1130419 A2 *  9/2001  ............... G02B 1/02
JP    5-132765 A    5/1993
(Continued)

OTHER PUBLICATIONS

Zhu, Xuejie, et al., "Superior stability for perovskite solar cells with 20% efficiency using vacuum co-evaporation". Nanoscale, 2017, 9, 12316-12323.*
(Continued)

*Primary Examiner* — Bret P Chen
(74) *Attorney, Agent, or Firm* — Westerman, Hattori, Daniels & Adrian, LLP

(57) ABSTRACT

A method for fabricating a perovskite film includes the steps of: placing a substrate on a substrate stage in a chamber, the substrate stage configured to rotate around its central axis at a rotation speed; depositing first source materials on the substrate from a first set of evaporation units, each coupled to the side section or the bottom section of the chamber; depositing second source materials on the substrate from a second set of evaporation units coupled to the bottom section, wherein the chamber includes a shield defining two or more zones having respective horizontal cross-sectional areas, which are open and facing the substrate, designated
(Continued)

for the two or more evaporation units in the second set. The perovskite film includes multiple unit layers each being formed by one rotation of the substrate stage, and having composition and thickness thereof controlled by adjusting evaporation rates, rotation speed and horizontal cross-sectional areas.

14 Claims, 13 Drawing Sheets

Related U.S. Application Data

(60) Provisional application No. 62/034,503, filed on Aug. 7, 2014.

(51) Int. Cl.

| | |
|---|---|
| C23C 16/52 | (2006.01) |
| C23C 14/06 | (2006.01) |
| C23C 14/12 | (2006.01) |
| C23C 14/50 | (2006.01) |
| C23C 14/54 | (2006.01) |
| C23C 16/40 | (2006.01) |
| C23C 16/455 | (2006.01) |
| C23C 16/46 | (2006.01) |
| H01L 31/0256 | (2006.01) |
| H01L 51/00 | (2006.01) |
| H01L 51/42 | (2006.01) |
| C07F 7/22 | (2006.01) |
| C07F 7/24 | (2006.01) |

(52) U.S. Cl.
CPC ............ *C23C 14/24* (2013.01); *C23C 14/243* (2013.01); *C23C 14/505* (2013.01); *C23C 14/542* (2013.01); *C23C 16/40* (2013.01); *C23C 16/45502* (2013.01); *C23C 16/46* (2013.01); *H01L 31/0256* (2013.01); *C07F 7/22* (2013.01); *C07F 7/24* (2013.01); *H01L 51/0008* (2013.01); *H01L 51/0029* (2013.01); *H01L 51/4226* (2013.01)

(56) References Cited

U.S. PATENT DOCUMENTS

| | | | |
|---|---|---|---|
| 6,117,498 | A | 9/2000 | Chondroudis et al. |
| 6,527,866 | B1 | 3/2003 | Matijasevic et al. |
| 2002/0015852 | A1 | 2/2002 | Noguchi et al. |
| 2004/0000379 | A1 | 1/2004 | Slyke et al. |
| 2005/0249869 | A1* | 11/2005 | Selvamanickam ... C23C 14/081 427/62 |
| 2010/0210059 | A1 | 8/2010 | Milshtein |
| 2015/0136232 | A1 | 5/2015 | Snaith et al. |
| 2015/0249170 | A1* | 9/2015 | Snaith ............. H01L 31/035272 136/256 |
| 2016/0218307 | A1* | 7/2016 | Huang ................. H01L 51/0028 |
| 2016/0254472 | A1* | 9/2016 | Wang .................. C23C 14/5846 136/263 |
| 2017/0084400 | A1* | 3/2017 | Cheng .................... C30B 29/12 |
| 2017/0229647 | A1* | 8/2017 | Qi ....................... H01L 51/0012 |

FOREIGN PATENT DOCUMENTS

| | | |
|---|---|---|
| JP | 2012-153959 A | 8/2012 |
| WO | 2013/171517 A1 | 11/2013 |
| WO | 2014/045021 A1 | 3/2014 |

OTHER PUBLICATIONS

Longo, Giulia, et al., "Perovskite solar cells prepared by flash evaporation". Chem. Commun., 2015, 51, 7376-7378.*
Reinoso, Miguel A., et al., "Improvement Properties of Hybrid Halide Perovskite Thin Films Prepared by Sequential Evaporation for Planar Solar Cells". Materials 2019, 12, 1394; doi:10.3390/ma12091394.*
Li, Jia, et al., "Highly Efficient Thermally Co-evaporated Perovskite Solar Cells and Mini-modules". Joule 4, 1035-1053, May 20, 2020.*
Liu, Mingzhen, et al., "Efficient planar heterojunction perovskite solar cells by vapour deposition". Nature, vol. 501, Sep. 19, 2013, pp. 395-402.*
Kang, Rira, et al., "Optimized Organometal Halide Perovskite Planar Hybrid Solar Cells via Control of Solvent Evaporation Rate". Journal of Physical Chemistry C, 2014, 118, 26513-26520.*
Gao, Cheng, et al., "Formation of organic-inorganic mixed halide perovskite films by thermal evaporation of PbCl2 and CH3NH3I compounds". RSC Advances, 2015, 5, 26175-26180.*
Liang, Guang-Xing, et al., "A promising unisource thermal evaporation for in situ fabrication of organolead halide perovskite CH3NH3PbI3 thin film". Progress in Photovoltaics: Research and Applications 2015; 23:1901-1907.*
Xing et al., "Low-temperature solution-processed wavelength-tunable perovskites for lasing", Nature Materials, Mar. 2014, pp. 1-5, cited in Specification (5 pages).
Tan et al., "Bright light-emitting diodes based on organometal halide perovskite", Nature Nanotechnology, Sep. 2014, vol. 9, pp. 687-692, cited in Specification (6 pages).
Yin et al., "Unique Properties of Halide Perovskites as Possible Origins of the Superior Solar Cell Performance", Advanced Materials, 2014, pp. 1-6, cited in Specification (6 pages).
Eperon et al., "Formamidinium lead trihalide: a broadly tunable perovskite for efficient planar heterojunction solar cells", Energy & Environmental Science, 2004, vol. 7, pp. 982-988, cited in Specification (7 pages).
Ogomi et al., "CH3NH3SnxPb(1-x)I3 Perovskite Solar Cells Covering up to 1060 nm", The Journal of Physical Chemistry Letters, 2014, vol. 5, pp. 1004-1011, cited in Specification (8 pages).
Choi et al., "Cesium-doped methylammonium lead iodide perovskite light absorber for hybrid solar cells", Nano Energy, 2014, vol. 7, pp. 80-85, cited in Specification (6 pages).
Liu et al., "Efficient planar heterojunction perovskite solar cells by vapour deposition", Nature, 2013, vol. 12509, cited in Specification and ISR (8 pages).
Park, "Organometal Perovskite Light Absorbers Toward a 20% Efficiency Low-Cost Solid-State Mesoscopic Solar Cell", The Journal of Physical Chemistry Letters, 2013, vol. 4, pp. 2423-2429, cited in Specification (7 pages).
Burschka et al., "Sequential deposition as a route to high-performance perovskite-sensitized solar cells", Nature, Jul. 18, 2013, vol. 499, cited in Specification (5 pages).
Ono et al., "Fabrication of semi-transparent perovskite films with centimeter-scale superior uniformity by the hybrid deposition method", Energy & Environmental Science, Dec. 2014, vol. 7, pp. 3989-3993, cited in ISR (7 pages).
International Search Report dated Oct. 6, 2015, issued in counterpart International Application No. PCT/JP2015/003450 (2 pages).
Malinkiewicz, O. et al, "Perovskite Solar Cells Employing Organic Charge-Transport Layers", Nature Photonics, Dec. 2013, pp. 1-5.
Extended (supplementary) European Search Report dated Jul. 3, 2017, issued in counterpart European Application No. 15828966.0 (8 pages).
Office Action dated Oct. 9, 2018, issued in counterpart Japanese application No. 2017-505580, with English translation. (11 pages).

* cited by examiner

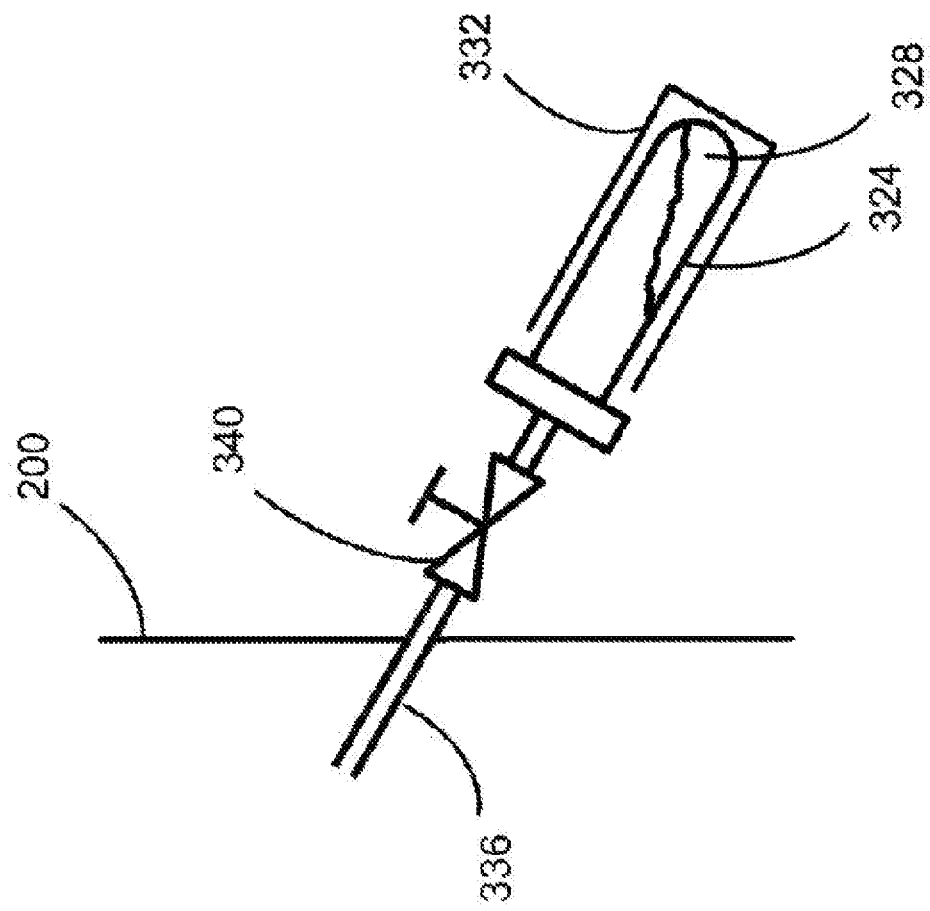
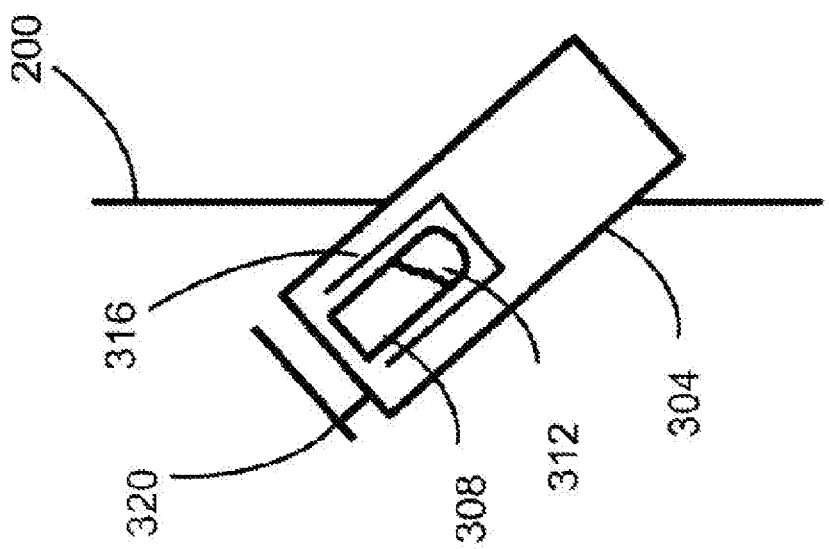
FIG. 3B
FIG. 3A

METHOD BASED ON MULTI-SOURCE DEPOSITION FOR FABRICATING PEROVSKITE FILM

CROSS REFERENCE TO RELATED APPLICATIONS

This is a divisional of U.S. patent application Ser. No. 15/502,331 filed Feb. 7, 2017 and, which is a 371 of PCT/JP2015/003450 filed Jul. 8, 2015 which claims the benefit of U.S. Provisional Application No. 62/034,503 filed Aug. 7, 2014, the entire contents of which are incorporated herein by reference.

TECHNICAL FIELD

The present invention relates to a system and method based on multi-source deposition for fabricating perovskite films.

BACKGROUND ART

A solar cell (also called a photovoltaic cell) is an electrical device that converts solar energy directly into electricity by using semiconductors that exhibit the photovoltaic effect. Solar photovoltaics is now, after hydro and wind power, the third most important renewable energy source in terms of globally installed capacity. Constructions of these solar cells are based around the concept of a p-n junction, wherein photons from the solar radiation are converted into electron-hole pairs. Examples of semiconductors used for commercial solar cells include monocrystalline silicon, polycrystalline silicon, amorphous silicon, cadmium telluride, and copper indium gallium diselenide. Solar cell energy conversion efficiencies for commercially available cells are currently reported to be around 14-22%.

High conversion efficiency, long-term stability and low-cost fabrication are essential for commercialization of solar cells. For this reason, a wide variety of materials have been researched for the purpose of replacing conventional semiconductors in solar cells. For example, the solar cell technology using organic semiconductors is relatively new, wherein these cells may be processed from liquid solution, potentially leading to inexpensive, large scale production. Besides organic materials, organometal halide perovskites, for example, $CH_3NH_3PbX_3$, where X=Cl, Br, I, or a combination thereof, have recently emerged as a promising material for the next generation of high efficiency, low cost solar technology. It has been reported that these synthetic perovskites exhibit high charge carrier mobility and lifetime that allow light-generated electrons and holes to move far enough to be extracted as current, instead of losing their energy as heat within the cell. These synthetic perovskites can be fabricated by using the same thin-film manufacturing techniques as those used for organic solar cells, such as solution processing, vacuum evaporation techniques, etc.

Recent reports have indicated that this class of materials, i.e., organometal halide perovskites, have potential for high-performance semiconducting media in optoelectronic devices as well. In particular, some perovskites are known to exhibit strong photoluminescence properties, making them attractive candidates for use in light-emitting diodes (LEDs). Additionally, it has been reported that the perovskites also exhibit coherent light emission properties, hence optical amplification properties, suitable for use in electrically driven lasers.

However, to date, it has been difficult to obtain highly uniform perovskite films with good stoichiometry based on the existing fabrication techniques. Furthermore, these existing techniques are not robust enough for fabricating perovskite films for bandgap engineering, multi junction or Tandem cell fabrication, doping control, heterostructure construction, and other advanced solar cell and optoelectronics applications. In view of ever increasing needs for low cost fabrication techniques of high-performance devices, a new fabrication technique is desired for producing highly uniform perovskite films suitable for solar cell and optoelectronics applications including LEDs and lasers.

CITATION LIST

Non Patent Literature

NPL1: Guichuan Xing et al., Low-temperature solution-processed wavelength-tunable perovskites for lasing. Nature Materials Vol. 13, 476-480 (March, 2014).
NPL2: Zhi-Kuan Tan et al., Bright light-emitting diodes based on organometal halide perovskite. Nature Nanotechnology Vol. 9, 687-692 (September, 2014).
NPL3: Wan-Jian Yin et al., Unique properties of halide perovskite as possible origins of the superior solar cell performance. Advanced Materials, DOI:10.1002/adma.201306281 (2014).
NPL4: Giles E. Eperon et al., Formamidinium lead trihalide: a broadly tunable perovskite for efficient planar heterojunction solar cells. Energy Environ. Sci. 7, 982-988 (2014).
NPL5: Yuhei Ogomi et al., $CH_3NH_3Sn_xPb_{(1-x)}I_3$ perovskite solar cells covering up to 1060 nm. J. Phys. Chem. Lett. 5, 1004-1011 (2014).
NPL6: Hyosung Choi et al., Cesium-doped methylammonium lead iodide perovskite light absorber for hybrid solar cells. Nano Energy 7, 80-85 (2014).
NPL7: Mingzhen Liu et al., Efficient planar heterojunction perovskite solar cells by vapour deposition. Nature Vol. 501, 395-398 (2013).
NPL8: Nam-Gyu Park, Organometal perovskite light absorbers toward a 20% efficiency low-cost solid-state mesoscopic solar cell. J. Phys. Chem. Lett. 4, 2423-2429 (2013).
NPL9: Julian Burschka et al., Sequential deposition as a route to high-performance perovskite-sensitized solar cells. Nature Vol. 499, 316-320 (July, 2013).

SUMMARY

A system and method for fabricating a perovskite film is provided, the system including a substrate stage configured to rotate around its central axis at a rotation speed, a first set of evaporation units, each coupled to the side section or the bottom section of the chamber, a second set of evaporation units coupled to the bottom section, and a shield defining two or more zones having respective horizontal cross-sectional areas, which are open and facing the substrate, designated for the two or more evaporation units in the second set. The resultant perovskite film includes multiple unit layers, wherein each unit layer is formed by one rotation of the substrate stage, and the composition and thickness of the unit layer are controlled by adjusting at least the evaporation rates, the rotation speed and the horizontal cross-sectional areas.

BRIEF DESCRIPTION OF DRAWINGS

FIGS. 3A and 3B illustrate examples of the evaporation unit in the first set coupled to the side section of the chamber.

DESCRIPTION OF EMBODIMENTS

Figure 1:
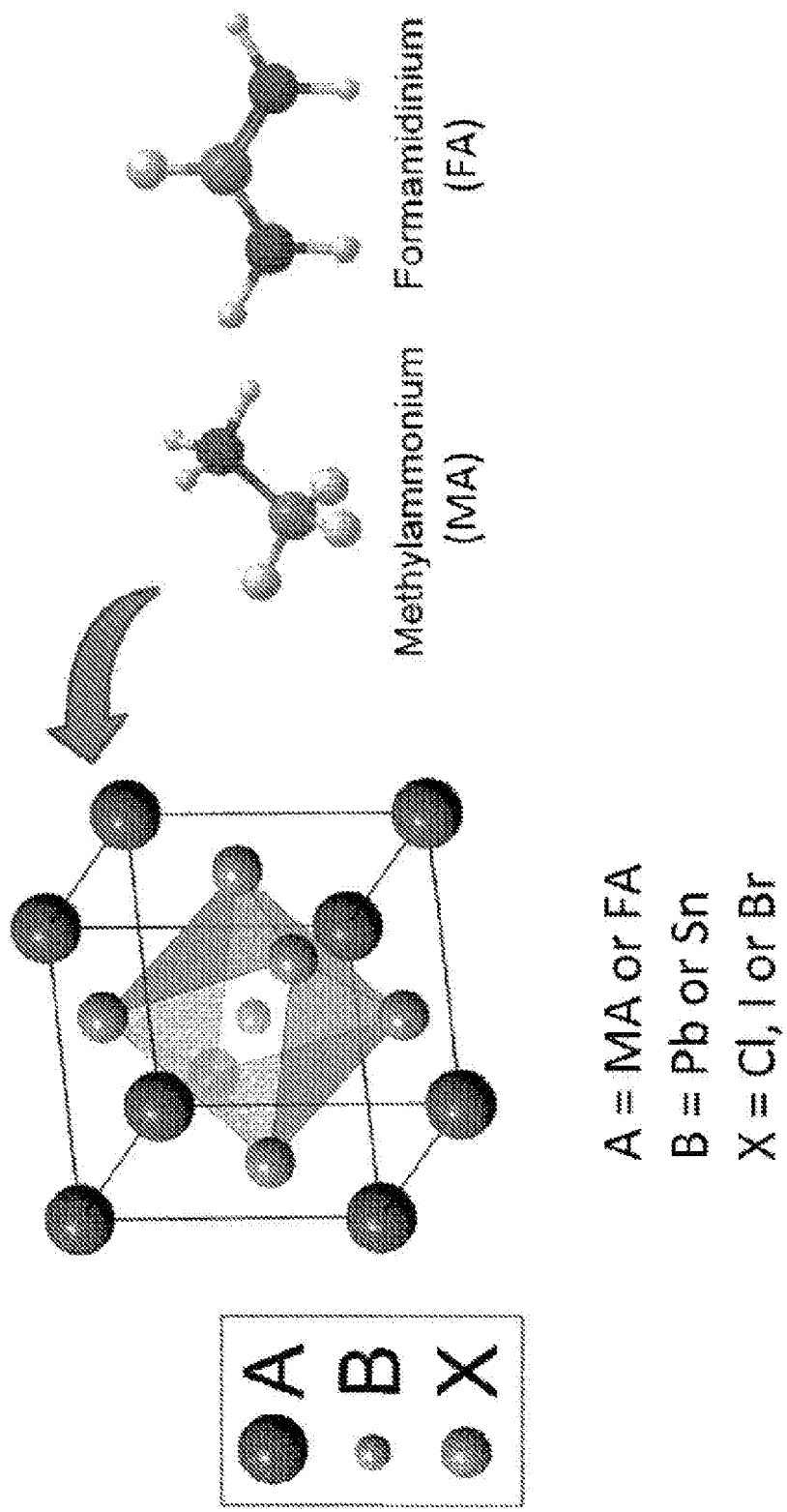
FIG. 1 illustrates a unit cell of an organometal halide perovskite structure. (See NPL4)

In view of ever increasing needs for low cost fabrication techniques of high-performance devices, this document describes a new fabrication system and method for producing highly crystalline, substantially uniform perovskite films for a wide variety of applications, such as bandgap engineering, multi junction or Tandem cell fabrication, doping control, heterostructure construction, and so on, especially suitable for solar cell and optoelectronics applications including LEDs and lasers. The present fabrication method may be regarded as a multi-source molecular-layer deposition, wherein multiple evaporators containing source materials are configured in a chamber, and multiple growth parameters are used to control the deposition to fabricate a perovskite film with a desired profile suitable for target applications. Here, the source materials include halide materials such as $PbCl_2$, $PbBr_2$, $PbI_2$, $SnCl_2$, $SnBr_2$, $SnI_2$ and the like, and methylammonium ($MA=CH_3NH_3^+$) compounds such as $CH_3NH_3Cl$, $CH_3NH_3Br$, $CH_3NH_3I$, and the like. In place of, or in a combination with the MA compound, a formamidinium ($FA=HC(NH_2)_2^+$) compound can also be used. FIG. 1 illustrates a unit cell of an organometal halide perovskite structure suitable for use for a light absorber. (See NPL4.) This is the orthorhombic structure having the general $ABX_3$ structure, in which an organic element, MA or FA, occupy each site A; a metal element, $Pb^{2+}$ or $Sn^{2+}$, occupy each site B; and a halogen element, $Cl^-$, $I^-$ or $Br^-$, occupy each site X. In this document, AX represents a compound having an organic element MA or FA for the A-cation combined with a halogen element Cl, I or Br for the X-anion; $BX_2$ represents a halide material having a metal element Pb or Sn for the B-cation combined with a halogen element Cl, I or Br for the X-anion. Examples and implementations according to the present system and method are described below with reference to accompanying drawings.

Figure 2:
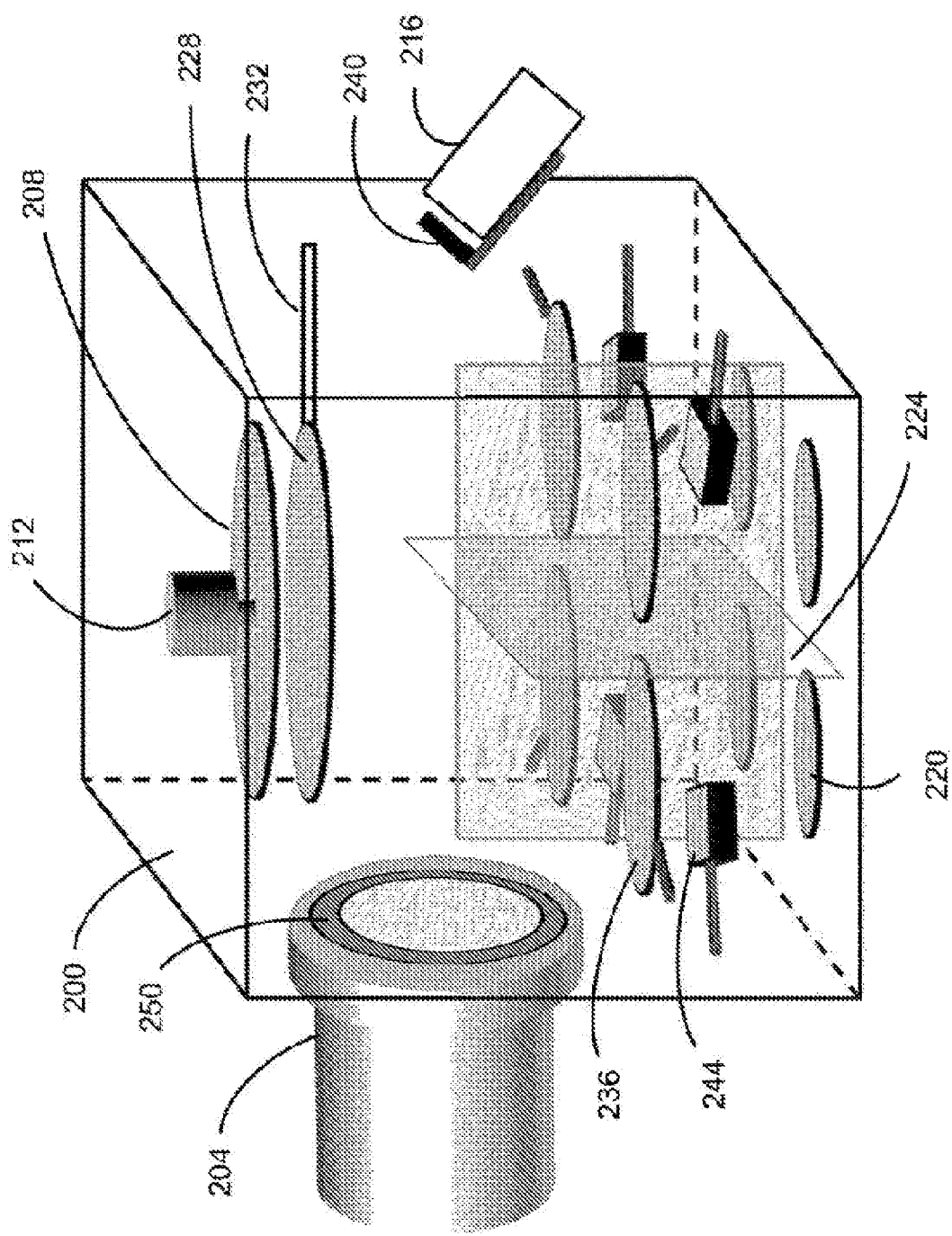
FIG. 2 illustrates an example of the system configuration for fabricating a perovskite film according to an embodiment.

FIG. 2 illustrates an example of the system configuration for fabricating a perovskite film according to an embodiment. The system includes a chamber 200 coupled to necessary parts. The chamber 200 in this example has a shape of substantially a hollow cube; however, the shape can be of substantially a hollow cylinder or any other closed hollow structure having a side section along the vertical direction and top and bottom sections along the horizontal direction. Each section has an internal surface and an external surface. In FIG. 2, only the internal surfaces of the chamber 200 are illustrated. The chamber 200 is coupled to a pump unit 204 for generating near vacuum in the chamber 200 for the deposition process. Examples of the pump unit 204 include a turbo molecular pump. The pump unit 204 in FIG. 2 is coupled to the side section of the chamber 200 so as to have the pumping direction substantially along the horizontal direction along a substrate stage 208. As explained later, this configuration allows for the flow of the AX vapor to circulate in the chamber 200 effectively so as to facilitate the chemical-reaction type of deposition on a substrate. The substrate stage 208 is coupled to the top section of the chamber 200 and configured to have a large stage surface facing downward for a substrate to be staged facing downward. The area of the stage surface is configured to accommodate a large-size substrate or multiple substrates. In this document, a term "substrate" is collectively used for one large-size substrate as well as for multiple separate substrates that are placed on the substrate stage 208. Examples of substrate materials include: fluorine-dope tin oxide (FTO) glass with electron collection layer (ECL) such as $TiO_2$ compact layer or ZnO thin film; indium tin oxide (ITO) glass with hole collection layer (HCL) such as PEDOT:PSS and NiO, where PEDOT:PSS stands for poly (3,4-ethylenedioxythiophene) polystyrene sulfonate; flexible substrate, such as polyethylene terephthalate, with either ECL or HCL. As explained later, a thin wetting layer can be added to any of the above substrate for enhancing the quality of a subsequently deposited perovskite film. The temperature of the substrate stage 208 can be controlled to provide uniform cooling or heating to the one or more substrates, ranging from −10° C. up to 350° C., for example. The substrate stage 208 is coupled to a motor 212, which drives to rotate the substrate stage 208 around the central axis during deposition. The rotation speed of the substrate stage 208 in the unit of Hz, for example, together with other parameters, can be predetermined based on desired deposition rates and film composition.

In FIG. 2, a first evaporation unit 216 is coupled to the side section of the chamber 200, and is configured for generating the AX vapor in the chamber 200. The first evaporation unit 216 may be configured to include a crucible to contain the AX compound in the form of powder, which can be heated to generate the AX vapor. In the example illustrated in FIG. 2, only one evaporation unit coupled to the side section of the chamber 200 for generating the AX vapor is shown. However, one or more evaporation units may be coupled to the side section of the chamber 200 for generating one or more types of vapors, respectively. Thus, the present system includes a first set of evaporation units comprising one or more evaporation units, each coupled to the side section of the chamber 200, wherein at least one evaporation unit in the first set is configured to generate the AX vapor. As explained later, another evaporation unit in the first set may be used to generate vapor of a material different from the AX material, such as a volatile dopant material. For example, one evaporation unit in the first set may generate the MACl vapor, and another evaporation unit in the first set may generate the FABr vapor. In another example, one evaporation unit in the first set may generate the MAI vapor, and another evaporation unit in the first set may generate the vapor of a volatile dopant material. Yet in another example, the first set may have only one evaporation unit for generating the FAI vapor.

In FIG. 2, a second evaporation unit 220 is coupled to the bottom section of the chamber 200, and is configured for generating the $BX_2$ vapor in the chamber 200. The second evaporation unit 220 may be configured to include a crucible to contain the $BX_2$ compound in the form of powder, which can be heated to generate the $BX_2$ vapor. In the example illustrated in FIG. 2, four evaporation units coupled to the bottom section of the chamber 200 are shown. For the purpose of fabricating multi-profile films such as a heterostructure or a multi junction structure, the present system may be configured to have a second set of evaporation units comprising two or more evaporation units coupled to the bottom section of the chamber 200, wherein at least one evaporation unit in the second set is configured to generate the $BX_2$ vapor. As explained later, another evaporation unit in the second set may be used to generate vapor of a material different from the $BX_2$ material, such as a non-volatile dopant material. For example, one evaporation unit in the second set may contain $PbCl_2$, and another evaporation unit may contain $SnI_2$. In another example, one evaporation unit may contain $PbBr_2$, and another evaporation unit may contain a non-volatile dopant material.

A shield 224 is structured to separate the two or more evaporation units in the second set coupled to the bottom section of the chamber 200, defining individual zones corresponding to these evaporation units. In the example of FIG. 2, where four evaporation units in the second set are provided, the shield 224 includes four rectangular plates defining four zones for the four evaporation units, respectively. The shield 224 reduces thermal interference between different types of vapors, enabling independent evaporation control of different compounds in the respective evaporation units. The plate structure of the shield 224 is configured to be vertically upright to define the individual zones with a predetermined height in the chamber 200 for giving rise to independent deposition behaviors. The zone designated for each of the evaporation units in the second set is configured to have a horizontal cross-sectional area that is open and facing the substrate surface. The horizontal cross-sectional areas of the separate zones, together with the rotation speed of the substrate stage 208, can be predetermined based on desired deposition rates and growth composition. The horizontal cross-sectional areas can be easily adjusted by repositioning the shield 224. Instead of a plate structure, a chimney-like structure having a shape such as a cylinder, a funnel, etc. may be configured to shield each evaporation unit from the others in the second set by designating a corresponding zone.

A shutter 228 is provided below the substrate stage 208, and is attached with a rod 232, which is used to move the shutter 228 to expose or cover the substrate stage 208. A push-pull linear motion device, for example, may be coupled to the rod 232 to provide longitudinal motion of the shutter 228 along the axis of the rod 232. Alternatively, the shutter 228, the rod 232 and their peripheral parts may be configured to control the exposing and covering of the substrate stage 208 based on rotational motion around a vertical axis, or any other suitable motion. The shutter 228 can be used to start or interrupt the deposition of the vapors onto the substrate from the evaporation units in the second set coupled to the bottom section of the chamber 200. A second shutter, which is for use as an evaporation shutter 236, may be provided for the evaporation unit 220 in the second set. In the example illustrated in FIG. 2, each of the four evaporation units 220 coupled to the bottom section of the chamber 200 has a corresponding evaporation shutter 236 above it. In the present system, two or more evaporation shutters such as 236 may be provided corresponding to two or more evaporation units in the second set, respectively. Adjustment of the evaporation shutter 236 is controlled by using a rod attached to the shutter 236 via longitudinal, rotational or any other suitable motion by using the rod. Each evaporation shutter 236 can be used for quick switching on/off of the vapor coming from the evaporation unit 220 into active deposition.

A first monitor 240 is provided near the opening of the evaporation unit 216 in the first set coupled to the side section of the chamber 200 to monitor the evaporation rate of the AX compound, for example. A sensing part of the first monitor 240 may be configured to face upward so as to monitor the AX vapor in the chamber rather than the AX vapor flux just coming out of the evaporation unit 216 in the first set. A second monitor 244 is provided above the evaporation unit 220 in the second set coupled to the bottom section of the chamber 200 and below the corresponding shutter 236, to monitor the evaporation rate of the $BX_2$ compound, for example. The second monitor 244 may be placed off the center of the evaporation unit 220 so as not to block the evaporated vapor during deposition. Each of the one or more evaporation units 216 in the first set coupled to the side section of the chamber 200 as well as each of the two or more evaporation units 220 in the second set coupled to the bottom section of the chamber 200 can be provided with a monitor to individually monitor the evaporation rates of the source materials. Examples of these monitors include a quartz crystal thickness monitor. The deposition rate and the film thickness in situ can be estimated based on the monitored evaporation rate using the tooling factor calculation, for example. In this calculation, the ratio between the measured film thickness and the indicated film thickness (as indicated by the monitored evaporation rate) is obtained during a trial run; thereafter, the ratio can be used to obtain the in situ film thickness by factoring in the evaporation rate during deposition as observed by the monitor.

Under certain conditions, the vapor of a volatile material such as AX becomes kinetically over-active and too much vapor may flow into the pump 204, degrading the internal surface of the pump 204, thereby decreasing the lifetime and/or increasing repair or maintenance cost. To circumvent this problem, a filter 250 is detachably attached at the opening of the pump 204 to the chamber 200. The filter may be made of a fine fabric mesh held by two concentric ring-shaped frames, as illustrated in FIG. 2. The entire filter 250 or the fabric mesh can be replaced as needed.

FIGS. 3A and 3B illustrate examples of the evaporation unit 216 in FIG. 2. Each example is illustrated as a configuration with respect to the internal side surface of the chamber 200. FIG. 3A illustrates a cell evaporator, such as a conventional Knudsen cell evaporator, having a cell 304 accommodating a crucible 308, in which the powder of the source material 312 can be contained. A heating element 316 is provided to heat the crucible 308, hence the powder 312, to generate its vapor. The temperature of the heating element 316 is controlled to adjust the evaporation rate of the source material. This cell evaporator may include also an evaporation shutter 320 to control the vapor flux. The cell evaporator of FIG. 3A is provided at an angle with respect to the internal side surface of the chamber 200, wherein the angle can be predetermined so that the vapor is outputted efficiently. The evaporation shutter 320 is provided to control the flux into the chamber 200 to avoid the strong flux of the vapor hitting directly the substrate mounted on the substrate stage 208. It is thus preferable that the evaporation shutter 320 is adjusted to be at a position, which allows for the vapor to output from the evaporator efficiently and yet prevents the vapor from directly hitting the substrate during deposition, for enhancing uniformity of the resultant film. FIG. 3B illustrates another example of the evaporation unit 216 in the FIG. 2, which includes an ampule 324 to contain the powder of the source material 328, and a heating element 332 provided to heat the ampule 324, hence the powder 328, to generate its vapor. The temperature of the heating element 332 is controlled to adjust the evaporation rate of the source material. The evaporation unit illustrated in FIG. 3B further includes a duct 336 to guide the vapor flux into the chamber 200, and is positioned at an angle with respect to the internal side surface of the chamber 200, wherein the angle can be predetermined so that the vapor is outputted efficiently. Alternatively, the duct 336 may be configured to have an extending section to output the vapor in a desired direction in the chamber 200. The duct 336 is coupled to an evaporation shutter 340 to open or close the duct 336 for controlling the vapor flow in a simple but timely manner. The shutter 340 is in the form of a valve in the present example. In the case where the evaporation unit of FIG. 3B is used for generating vapor of a dopant material, the dopant material is contained in the ampule 324, and the evaporation shutter 340 such as a valve can be used to control the doping profile in the resultant film. Referring back to FIG. 2, the pump unit 204 is coupled to the side section of the chamber 200 so as to have the pumping direction substantially along the horizontal direction. The present system configuration having both the pump unit 204 and the evaporation unit 216 coupled to the side section allows for the vapor flow of the source material, such as AX, to circulate in the chamber 200 effectively, thereby facilitating the chemical-reaction type of deposition on the substrate.

Figure 4B:
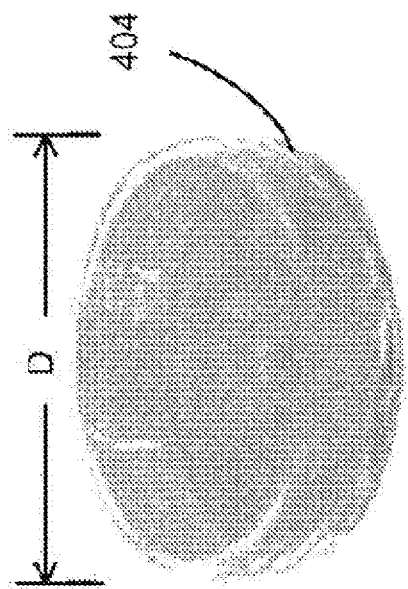
FIGS. 4A-4C illustrate an example of the evaporation unit in the second set coupled to the bottom section of the chamber.
Figure 4C:
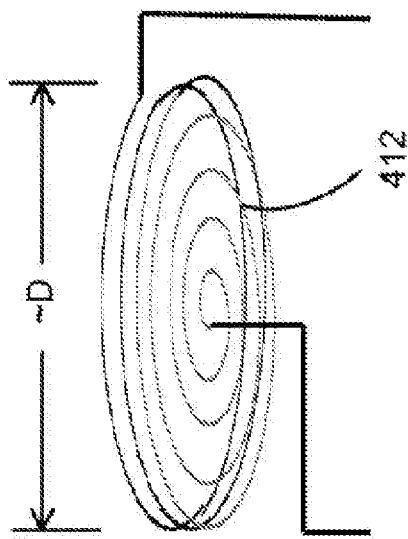
Figure 4A:
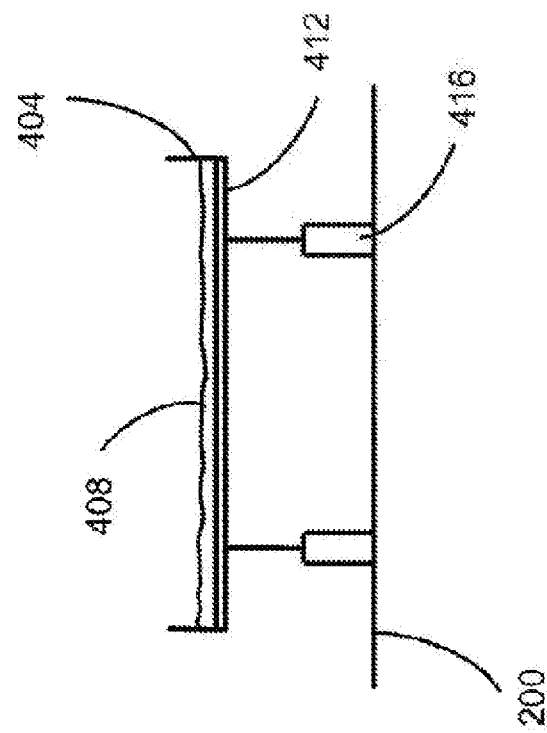

FIGS. 4A-4C illustrate an example of the evaporation unit 220 in FIG. 2. FIG. 4A illustrates a cross-sectional side view, wherein the evaporation unit 220 includes a crucible 404 to contain the powder of the source material 408, such as $BX_2$, and a heating element 412 to heat the crucible 404, hence the powder 408, to generate its vapor. Two end terminals of the heating element 412 are held by two electric feedthroughs 416, respectively, to communicate with the outside of the chamber 200, whereby the heating element 412 can be controlled externally. FIG. 4B illustrates a perspective view of the crucible 404, which has a dish shape in this example, with the diameter D as large as possible within the dedicated zone in the chamber 200. The horizontal cross-sectional shape of the crucible 404 can be a square, a rectangle, an oval, a hexagon or any other shape. FIG. 4C illustrates a perspective view of the heating element 412, which is a spiral-shaped tungsten filament and tightly surrounds the dish-shaped crucible 404, in this example. The heating element 412 can be formed in a mesh shape, a meander shape, a zig-zag shape or any other shape, as long as it is configured to heat the crucible 404 uniformly to control the evaporation rate of the source material effectively. In the present example, the diameter of the spiral is configured to be approximately the same as the diameter D of the dish-shaped crucible 404 of FIG. 4B.

Physical vapor deposition is an example of fabrication technique used in semiconductors, microelectronics and optical industries. The source material is typically heated and vaporized until its vapor pressure is high enough to produce a flux. The deposition onto the substrate involves purely physical process such as high-temperature vacuum evaporation with subsequent condensation or plasma sputter bombardment. Thus, line-of-sight transfer is typical for most of physical vapor deposition techniques, in which the direction of the vapor flux of the source material is directed toward the substrate. Since particles tend to follow a straight path, films deposited by physical vapor deposition are generally directional, rather than conformal. In contrast, in chemical vapor deposition, chemical reaction takes place on the substrate surface to produce the conformal uniform morphology.

In view of the conventional chemical and physical vapor deposition techniques, the fabrication technique based on the present system and method may be regarded as a hybrid of both techniques. Supposing the present system in FIG. 2 is configured to have one AX source in the evaporation unit 216 coupled to the side section of the chamber 200 and one $BX_2$ source in the evaporation unit 220 coupled to the bottom section, the deposition mechanism can be qualitatively described as follows: (i) the AX vapor is circulated to fill the chamber 200, which is enabled by adjusting the evaporation rate of the AX compound via the temperature control of the evaporation unit 216 and the flow speed of the AX vapor via the pressure control by using the pump unit 204, wherein both the evaporation unit 216 for AX and the pump unit 204 are coupled to the side section of the chamber 200 to allow for effective control of the AX vapor flow; (ii) the $BX_2$ compound is heated in the evaporation unit 220 coupled to the bottom section, and the resultant $BX_2$ vapor travels substantially vertically directing to the substrate stage 208, whereby the deposition of the $BX_2$ vapor is substantially directional, following the vertical line-of-sight transfer, while the deposition of the AX vapor is substantially less directional; (iii) the $BX_2$ vapor hits the substrate surface and is deposited thereon effectively based partially on the good sticking coefficient and wettability of the $BX_2$ material; and (iv) the chemical reaction takes place between the deposited $BX_2$ and the AX vapor existent in the proximity of the substrate surface. Thus, the present configuration effectuates a substantially uniform chemical reaction on a large area of the substrate surface or multiple substrate surfaces, resulting in a large-scale, uniform perovskite film with high crystallinity even without annealing. Furthermore, an efficient chemical reaction on the substrate surface can be promoted, and thus the speed of the film growth can be made significantly fast, by optimizing the evaporation rates of source materials via the respective temperature controls, and the circulation of the AX vapor, hence the AX incorporation ratio to the deposited $BX_2$, via the pressure control by using the pump unit 204. Furthermore, the initial deposition control and the film thickness control are enabled primarily by the open/close of the shutter 228 for the substrate stage 208.

Therefore, the present fabrication process is inherently different from a typical physical vapor co-deposition process. In a typical physical vapor co-deposition process, two evaporators need to be situated side-by-side with an angle so that both vapor flows are directed at the substrate surface to have line-of-sight transfer of both source materials. Accordingly, each of the vapor flows reaches the substrate surface at an angle, limiting the overlap region of the two vapor flows. That is, the stoichiometry of the resultant perovskite film in the central region is different from that in the edge region of the film. Therefore, the substrate size is limited, and the crystallinity of the resultant perovskite film tends to be of low quality even after annealing because of non-uniform concentration of the two source materials (e.g., AX and $BX_2$). Furthermore, the present system includes the horizontally situated pump unit 204 to effectuate optimal flow of the AX vapor over the substrate surface, thereby optimizing the AX incorporation ratio to the deposited $BX_2$, whereas such flow control does not lead to benefits for physical vapor deposition because it is irrelevant to the operation principles based on a purely physical process in the molecular regime.

Figure 5:
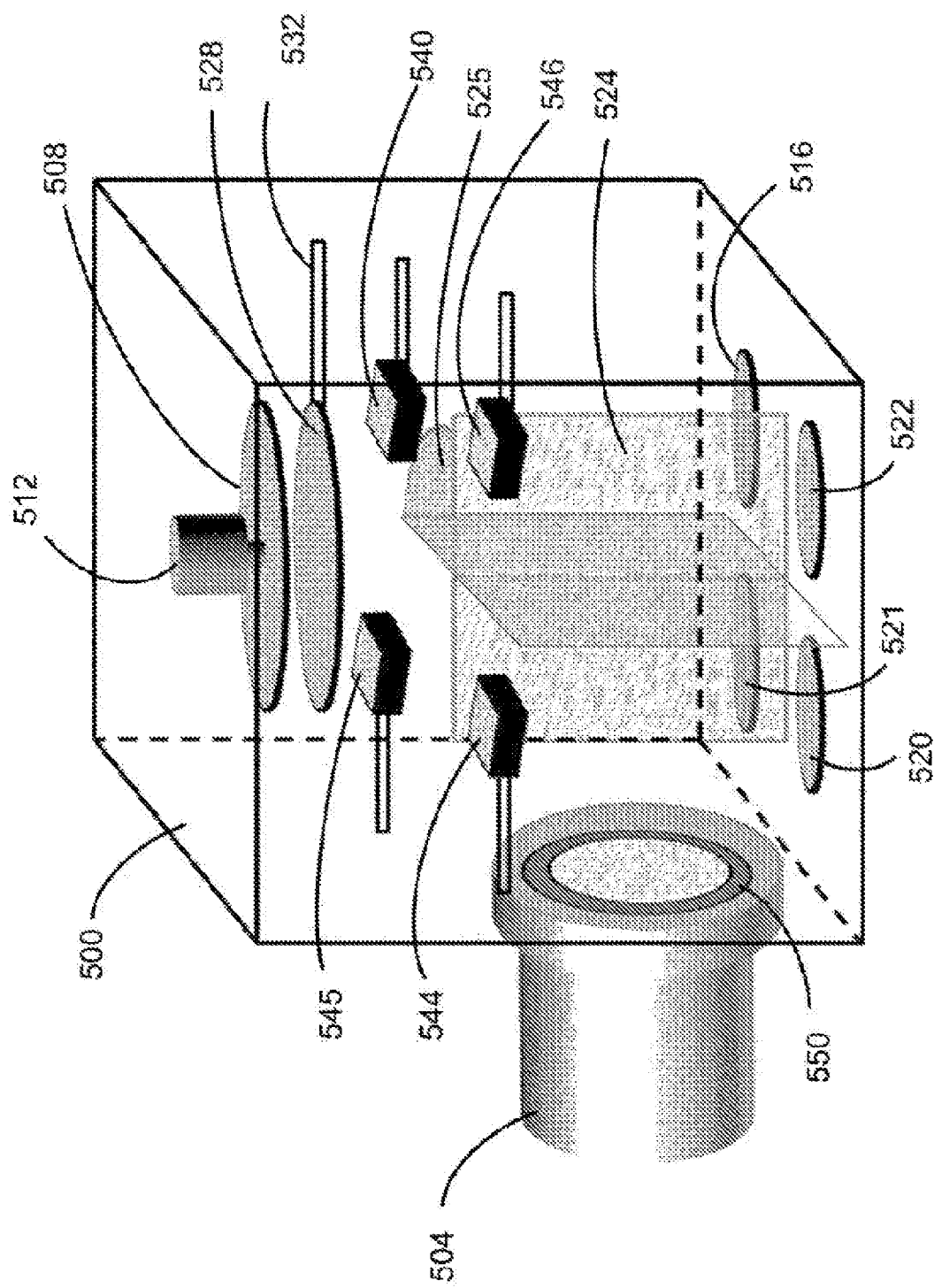
FIG. 5 illustrates another example of the system configuration for fabricating a perovskite film according to an embodiment

FIG. 5 illustrates another example of the system configuration for fabricating a perovskite film according to an embodiment. The system includes a chamber 500 coupled to necessary parts. Similar to the system configuration illustrated in FIG. 2, a pump unit 504 is coupled to the side section of the chamber 500 for generating near vacuum in the chamber 500; a substrate stage 508 is coupled to the top section of the chamber 500 for a substrate to be staged facing downward; a shutter 528 is provided below the substrate stage 508 and is attached with a rod 532, which is used to move the shutter 528 to expose or cover the substrate stage 508; the substrate stage 508 is coupled to a motor 512, which drives to rotate the substrate stage 508 around the central axis. In contrast to FIG. 2, in which a first evaporation unit 216 configured for generating the AX vapor is coupled to the side section of the chamber 200, in the system illustrated in FIG. 5 a first evaporation unit 516 is coupled to the bottom section of the chamber 500. Examples of types of the first evaporation unit 516 coupled to the bottom section include a cell evaporator illustrated in FIG. 3A, an ampule with a heating element illustrated in FIG. 3B, and a crucible with a heating element as illustrated in FIGS. 4A-4C. A set of second evaporation units 520, 521 and 522 are coupled also to the bottom section, wherein at least one of the second evaporation units 520, 521 and 522 is configured to generate the $BX_2$ vapor. Although not shown in FIG. 5, an evaporation shutter, such as the one 236 in the system illustrated in FIG. 2, may be provided for each of the four evaporation units 516, 520, 521 and 522, for use for quick switching on/off of the vapor coming from the evaporation unit into active deposition. Monitors 540, 544, 545 and 546 are provided above the evaporation units 516, 520, 521 and 522, respectively, to monitor the evaporation rates of the source materials coming out from the respective evaporation units. A filter 550 may be detachably attached at the opening of the pump 504. The filter 550 may be made of a fine fabric mesh held by two concentric ring-shaped frames, as illustrated in FIG. 5.

A shield 524 is structured to separate the four evaporation units 516, 520, 521 and 522 coupled to the bottom section of the chamber 500, defining individual zones corresponding to these evaporation units. In this example, the shield 524 includes four rectangular plates defining four zones for the four evaporation units 516, 520, 521 and 522, respectively, to reduce thermal interference between different types of vapors, enabling independent evaporation control of different materials in the respective evaporation units. The structure of the shield 524 is configured to include vertically upright plates to define the individual zones with a predetermined height in the chamber 500 for facilitating independent deposition behaviors. The shield structure around the first evaporation unit 516, however, is configured differently from the shield structure around each of the second evaporation units 520, 521 and 522, in that a top shield portion 525 is provided above the first evaporation unit 516. That is, the shield structure 524 includes the top shield portion 525 only above the first evaporation unit 516. The shield structure around the first evaporation unit 516 allows for the AX vapor to effectively circulate in the chamber 500, without directly hitting the substrate surface. On the other hand, the shield structure around each of the second evaporation unit 520, 521 and 522 allows for the deposition of the source vapor therefrom to be substantially directional, following the line-of-sight transfer to the substrate surface. The zone designated for each of the evaporation units in the second set, 520, 521 and 522, is configured to have a horizontal cross-sectional area that is open and facing the substrate surface. The horizontal cross-sectional areas of the separate zones designated for the evaporation units in the second set, 520, 521 and 522, together with the rotation speed of the substrate stage 508, can be predetermined based on desired deposition rates and growth composition. Instead of a plate structure, a chimney-like structure having a shape such as a cylinder, a funnel, etc. may be configured to shield each evaporation unit from the others. In this case, the opening portion of the shield structure for the first evaporation unit 516 may be oriented to face away from the substrate stage 508 so as to reduce the direct deposition of the AX vapor onto the substrate surface and to promote the circulation in the chamber 500. Additionally or alternatively to having the top shield 525 above the first evaporator unit 516 or configuring the opening portion of the shield structure for the first evaporation unit 516 to face away from the substrate surface, the first evaporation unit 516 itself may be placed horizontally away from the second evaporation units 520, 521 and 522, so that the overlap between the horizontal cross-sectional area of the substrate stage 508 and that of the first evaporation unit 516 is avoided.

In the system illustrated in FIG. 5, one first evaporation unit 516 and three second evaporation units 520, 521 and 522 are coupled to the bottom section of the chamber 500. However, one or more first evaporation units may be coupled to the bottom section of the chamber 500. A shield is structured around each of the evaporation unit in the first set so as to reduce direct deposition of the source vapor onto the substrate surface, thereby promoting circulation of the source vapor in the chamber 500. Alternatively, all the first evaporation units may be coupled to the side section of the chamber, as illustrated in FIG. 2. Yet alternatively, one or more of the first evaporation units may be coupled to the bottom section, and the other first evaporation units may be coupled to the side section. That is, the present system is configured to include a first set of evaporation units comprising one or more evaporation units, each coupled to the side section of the chamber or to the bottom section of the chamber with a proper shield structure around it, wherein at least one evaporation unit in the first set is configured to generate the AX vapor.

The present system illustrated in FIG. 2 or FIG. 5 is configured to include multiple sources and is capable of controlling the growth profile at the monolayer or sub-monolayer level based primarily on the evaporation rates, the rotation speed of the substrate stage 208/508 and the zoning afforded by the shield 224/524. The operation principle of the present system and method including multiple sources is explained below.

Here, the case of having one AX source and N $BX_2$ sources is considered for illustrative purposes. The AX source is contained in the evaporation unit in the first set that is coupled to the side section of the chamber or to the bottom section of the chamber with a proper shield structure around it, as illustrated in FIG. 2 or 5, for generating the AX vapor with the evaporation rate of $R_{AX}$. The N $BX_2$ sources are contained in the $S_1, S_2 \ldots$ and $S_N$ evaporation units in the second set coupled to the bottom section of the chamber, for generating the $S_1, S_2 \ldots$ and $S_N$ vapors with the evaporation rates of $R_1, R_2 \ldots$ and $R_N$, respectively. The rotation speed and evaporation temperatures are predetermined to provide desired evaporation rates, $R_{AX}, R_1, R_2 \ldots$ and $R_N$ in the unit of ML/rotation, where ML stands for monolayer. The rotation speed is set to be M Hz. For the evaporation rates, the unit of ML/sec can alternatively be used, where ML/sec=ML/(M rotations) holds for the case of using the rotation speed of M Hz. Each of the $S_1, S_2 \ldots$ and $S_N$ evaporation units is placed in a zone defined by the shield, as illustrated in FIG. 2 or 5, and the horizontal cross-sectional areas of the zones designated for these evaporation units are $A_1, A_2 \ldots$ and $A_N$, respectively. Assuming $R_{AX}$ is properly chosen to ensure stoichiometry and all evaporation shutters are open during deposition, after each rotation, i.e., the rotation of the substrate stage 208/508 around its central axis by 360%, the deposited film has the following structure:

Sub-Layer 1 comprises $S_1$ with thickness $t_1 = R_1 \times [A_1/(A_1+A_2+\ldots+A_N)]$ Sub-Layer 2 comprises $S_2$ with thickness $t_2 = R_2 \times [A_2/(A_1+A_2+\ldots+A_N)]$ Sub-Layer N comprises $S_N$ with thickness $t_N = R_N \times [A_N/(A_1+A_2+\ldots+A_N)]$  Eq. (1)

The above multilayer structure, comprising Sub-Layer 1 through Sub-Layer N, formed after one rotation can be defined as a unit layer $(t_1/t_2/\ldots/t_N)$. After one second, the film comprises M repeating unit layers as follows:

$(t_1/t_2/\ldots/t_N)/(t_1/t_2/\ldots/t_N)//(t_1/t_2/\ldots/t_N)$.  Eq. (2)

Strictly speaking, in the above illustration, the initial layers will be different from location to location of the substrate surface if one large substrate is used, since the initial vapors of different $BX_2$ materials hit different locations of the substrate surface. Thereafter, the deposition will proceed like forming a swirl of each deposited material as the substrate stage 208/508 rotates many times. However, in actual fabrications, the deposition continues to grow a film with a thickness of 50-400 nm, for example, containing hundreds or thousands of layers. Thus, the difference in initial layers becomes non-essential, and the growth profile can be approximated by layer-by-layer in practice. If multiple substrates are used, these substrates mounted on different locations on the substrate stage 208/508 have different initial layers. Again, the difference in initial layers becomes non-essential after the deposition of hundreds or thousands layers. For example, supposing Structure $1=S_1/S_2/S_1/S_2\ldots$ is formed on one substrate, and Structure $2=S_2/S_1/S_2/S_1\ldots$ is formed on another substrate, these structures can be viewed as: Structure $2=S_2/S_1/S_2/S_1=S_2/$(Structure 1). Therefore, in the practical application of the present system and method, the difference in the initial layers becomes non-essential. That is, similar to using one large substrate, two or more separate substrates can be placed radially on the substrates stage 208 to achieve the layer-by-layer growth. For example, a round substrate stage with a diameter of ~9 cm and four square substrates with each side of ~1.5 cm may be used, wherein the four substrates are radially placed on the substrate stage ~90° apart from each of the adjacent ones.

Examples of fabricating perovskite films using the present multi-source system and method are described below, wherein the numerical values are given only for illustrative purposes.

Example 1

There are two evaporation units, containing two $BX_2$ sources, coupled to the bottom section of the chamber and placed in two zones, respectively, where the two $BX_2$ compounds are $S_1=SnI_2$ and $S_2=PbI_2$; there is one evaporation unit containing AX=MAI, which is coupled to the side section of the chamber or to the bottom section of the chamber with a proper shield structure around it, as illustrated in FIG. 2 or 5. The evaporation rates are: $R_1=1$ ML/rotation, $R_2=1$ ML/rotation, and $R_{MAI}=0.5$ ML/rotation. The zone area distribution is: $A_1=A_2=0.5\times(A_1+A_2)$. The rotation speed is 2 Hz. The evaporation shutters for all the sources are open during deposition. After each rotation, the deposited film comprises the Pb—Sn mixed perovskite with stoichiometry balanced at 1:1 ratio: 0.5 ML $MASnI_3$/0.5 ML $MAPbI_3$. After one second, the film comprises two repeating unit layers, i.e., (0.5 ML $MASnI_3$/0.5 ML $MAPbI_3$)/(0.5 ML $MASnI_3$/0.5 ML $MAPbI_3$).

Example 2

There are two evaporation units, containing two $BX_2$ sources, coupled to the bottom section of the chamber and placed in two zones, respectively, where the two $BX_2$ compounds are $S_1=SnI_2$ and $S_2=SnBr_2$; there is one evaporation unit containing AX=MAI, which is coupled to the side section of the chamber or to the bottom section of the chamber with a proper shield structure around it, as illustrated in FIG. 2 or 5. The evaporation rates are: $R_1=4$ ML/rotation, $R_2=1$ ML/rotation, and $R_{MAI}=2.5$ ML/rotation. The zone area distribution is: $A_1=A_2=0.5\times(A_1+A_2)$. The rotation speed is 3 Hz. The evaporation shutters for all the sources are open during deposition. After each rotation, i.e., the rotation of the substrate stage 208/508 around its central axis by 360°, the deposited film comprises the I—Br mixed perovskite with stoichiometry balanced at 13:2 ratio: 2 ML $MASnI_3$/0.5 ML $MASnIBr_2$. After one second, the film comprises 3 repeating unit layers, i.e., (2 ML $MASnI_3$/0.5 ML $MASnIBr_2$)/(2 ML $MASnI_3$/0.5 ML $MASnIBr_2$)/(2 ML $MASnI_3$/0.5 ML $MASnIBr_2$).

Example 3

There are three evaporation units, containing three source materials, coupled to the bottom section of the chamber and placed in three zones, respectively, where the two sources are $BX_2$ compounds, $S_1=SnI_2$ and $S_2=SnBr_2$, and the third source is a non-volatile dopant source, $S_3=Bi(NO_3)_3$ (or $BiX_3$ where X=F, Cl, Br or I); there is one evaporation unit containing AX=FAI, which is coupled to the side section of the chamber or to the bottom section of the chamber with a proper shield structure around it, as illustrated in FIG. 2 or 5. The evaporation rates are: $R_1=2.7$ ML/rotation, $R_2=2.7$ ML/rotation, $R_3=0.6$ ML/rotation, and $R_{FAI}=0.67$ ML/rotation. The zone area distribution is: $A_1=A_2=A_3=0.33\times(A_1+A_2+A_3)$. The rotation speed is 5 Hz. The evaporation shutters for all the sources are open during deposition. After each rotation, the deposited film comprises the I—Br mixed formamidinium perovskite with a 10% doping concentration of Bi with stoichiometry balanced at 2:1 ratio: 1 ML $FASn_{0.9}Bi_{0.1}I_3$/1 ML $FASn_{0.9}Bi_{0.1}IBr_2$. After one second, the film comprises three repeating unit layers, i.e., (1 ML $FASn_{0.9}Bi_{0.1}I_3$/1 ML $FASn_{0.9}Bi_{0.1}IBr_2$)/(1 ML $FASn_{0.9}Bi_{0.1}I_3$/1 ML $FASn_{0.9}Bi_{0.1}IBr_2$)/(1 ML $FASn_{0.9}Bi_{0.1}I_3$/1 ML $FASn_{0.9}Bi_{0.1}IBr_2$).

In the above Example 3, the doping concentration of 10% is considered as an example. Generally, it is difficult to achieve PPM-level doping concentrations. However, for solar cell applications, the required doping concentration is expected to be higher for polycrystalline films including perovskite films than monocrystalline films such as single crystal Si films. It is not uncommon to find reported doping concentrations as high as 10% in organic amorphous semiconductors. In view of the tolerance levels of various growth parameters, it is expected that the present system and method can be used to realize a doping concentration of 0.1% or smaller.

In the above Example 3, one of the evaporation units coupled to the bottom section is used to generate vapor of a non-volatile dopant source. If the dopant material is volatile, it is preferable to use one of the evaporation units coupled to the side section of the chamber or to the bottom section of the chamber with a proper shield structure around it, as illustrated in FIG. 2 or 5. This is because a volatile dopant source tends to readily vaporize at a relatively low temperature, and thus the volatile dopant source is qualitatively similar in characteristics to the organic AX compounds (MAGI, MABr, MAI, FACT, FABr, FAI and the like). The characteristics can be utilized in the present system and method to circulate the vapor in the chamber for optimal incorporation of the volatile material to the deposited $BX_2$.

Example 4

There are two evaporation units, containing two source materials, coupled to the bottom section of the chamber and placed in two zones, respectively, where the two sources are $BX_2$ compounds, $S_1=SnI_2$ and $S_2=SnBr_2$; there are two evaporation units, each coupled to the side section of the chamber or to the bottom section of the chamber with a proper shield structure around it, as illustrated in FIG. 2 or 5, one containing AX=FAI and the other containing a volatile dopant material $I_2$. The evaporation unit including an ampule with an evaporation shutter in the form of a valve, such as illustrated in FIG. 3B, may be used for generating vapor of the volatile dopant material $I_2$.

Example 5

There are two evaporation units, containing two source materials, coupled to the bottom section of the chamber and placed in two zones, respectively, where the two sources are $BX_2$ compounds, $S_1=PbI_2$ and $S_2=SnI_2$; there is one evaporation unit containing AX=MAI, which is coupled to the side section of the chamber or to the bottom section of the chamber with a proper shield structure around it, as illustrated in FIG. 2 or 5. The evaporation rates are: $R_1=1$ ML/rotation, $R_2=1$ ML/rotation, and $R_{MAI}=0.5$ ML/rotation. The zone area distribution is: $A_1=A_2=0.5\times(A_1+A_2)$. The rotation speed is 1 Hz. A two-step deposition process is carried out by having the evaporation shutter open for $S_1=PbI_2$ and the evaporation shutter closed for $S_2=SnI_2$ in the first step, and vice versa in the second step. After the first step with 600 rotations=600 seconds, the deposited film comprises 600×(0.5 ML $MAPbI_3$)=300 ML $MAPbI_3$. After the second step with 600 rotations=600 seconds, the deposited film comprises 300×(0.5 ML $MASnI_3$)=300 ML $MASnI_3$ on top of the first deposited film, resulting in a perovskite heterostructure having 300 ML $MAPbI_3$/300 ML $MASnI_3$. Thus, the perovskite heterostructure can be obtained by using the two- or more-step deposition process based on the present system and method.

According to the present system and method, the layer thickness and composition can be controlled at the monolayer or sub-monolayer level via the rotation speed of the substrate stage 208/508 and the zone area distribution as expressed in Eq. (1), in addition to the evaporation temperatures that determine the respective evaporation rates. Accordingly, as exemplified in the above Examples 1-5, the present system and method can be configured to fabricate various perovskite structures suitable for a wide variety of advanced applications. The present system includes: a chamber having a closed hollow structure that has a side section along a vertical direction and top and bottom sections along a horizontal direction; a substrate stage coupled to the top section of the chamber and configured to have a stage surface facing vertically downward for a substrate to be placed and to rotate around a central axis at a rotation speed; a first set of evaporation units comprising one or more evaporation units, each coupled to the side section or to the bottom section of the chamber, for generating vapors of one or more first source materials with one or more first evaporation rates, respectively, wherein at least one of the one or more first source materials is the AX; a second set of evaporation units comprising two or more evaporation units coupled to the bottom section of the chamber for generating vapors of two or more second source materials with two or more second evaporation rates, respectively, wherein at least one of the two or more second source materials is the $BX_2$; and a shield for separating two or more evaporation units coupled to the bottom section of the chamber, defining two or more zones designated for the two or more evaporation units coupled to the bottom section, respectively. The zone designated for each of the two or more evaporation units in the second set is configured to have a horizontal cross-sectional area that is open and facing the substrate surface. The first set of evaporation units, the second set of evaporation units and the shield are configured to enable deposition of each of the two or more second source materials to be substantially directional by vertical line-of-sight transfer, and deposition of each of the one or more first source materials to be substantially less directional by circulating the vapor of the first source material in the chamber. At least the one or more first evaporation rates, the two or more second evaporation rates, the rotation speed and the two or more horizontal cross-sectional areas are adjusted to control composition and thickness of a unit layer to fabricate the perovskite film comprising a plurality of unit layers, wherein each unit layer is formed by one rotation of the substrate stage.

The present system and method can be configured to fabricate doped perovskite films, as in Examples 3 and 4 above. It is reported that undoped (or unintentionally doped) perovskites are mostly n-type. Thus, successful synthesis of p-type perovskites can lead to the p-n junction formation for a perovskite solar cell. The p-type perovskite may be generally expressed as D p-doped $ABX_3$, where D is a dopant material such as the volatile $I_2$ or the non-volatile $Bi(NO_3)_3$, $BiX_3$, and the like. These dopants provide free holes when incorporated in the $ABX_3$ structure. To intentionally n-dope a perovskite film, n-type dopant materials E can be used, where E=methylammonium, formamidinium, Pb, $InX_3$, and the like. These dopants provide free electrons when incorporated in the $ABX_3$ structure to give E n-doped $ABX_3$. In addition, the present system and method enables dopant profile tuning by gradually adjusting the rotation speed and/or the zone area distribution, whereby the doping concentration can be gradually varied in the perovskite film.

Furthermore, the present system and method can be configured to fabricate perovskite heterostructures, as in Example 5, for forming Tandem or multi junction structures. Examples of such structures include: a perovskite p-n junction, i.e., p-type perovskite/n-type perovskite or vice versa; a perovskite film on Si, such as p-type Si/n-type perovskite, n-type Si/p-type perovskite, etc.; a perovskite film on an organic material, such as PCBM/perovskite, where PCBM stands for Phenyl-C61-Butyric acid Methyl ester. Tandem and multi junction solar cells generally exhibit high conversion efficiency. It has been reported that a prior art example of a general Tandem solar cell can exhibit 47% efficiency under the AM1.5G spectrum, having bandgaps of 1.63 eV and 0.96 eV. It is expected that comparable or even higher efficiency can be achieved by using a Tandem or multi junction perovskite solar cell.

Additionally, the present system and method can be configured for bandgap engineering. For example, the bandgap of a mixed-halide perovskite such as $FAPbI_xBr_{3-x}$ can be tuned within a certain range by varying the halide composition, enabling variation in color, for example. Other examples include $MASnxPb_{1-x}I_3$, in which the bandgap can be varied by varying the metal composition. The present system and method, via implementation of multiple source and independent control of a wide variety of growth parameters, offers suitable means for bandgap engineering, such as in situ tuning, precise thickness control, concentration profile design, and so on.

Furthermore, the present system and method can be configured to create a one-station process for the full cell fabrication by implementing deposition of the electron or hole collection materials, top electrode material, encapsulation material and other materials all in the same chamber.

Referring back to the perovskite structure illustrated in FIG. 1, it is generally known that materials can be considered as candidates for solar cells as long as the tolerance factor, t, defined below does not deviate significantly from 1:

$$t = \frac{r_A + r_X}{\sqrt{2}\,(r_B + r_X)}, \qquad \text{Eq. (3)}$$

where $r_A$ is the radius of the A-cation, $r_B$ is the radius of the B-cation, and $r_X$ is the radius of the X-anion. The above tolerance factor, t, known to those skilled in the art as the Goldschmidt tolerance factor, is an indicator for the stability and distortion of crystal structures. Thus, based on the design guideline using the tolerance factor, new perovskite materials for solar cells can be devised by using the present system and method that implements multiple sources and independent control of a wide variety of growth parameters in a versatile and comprehensive fashion.

Figure 6:
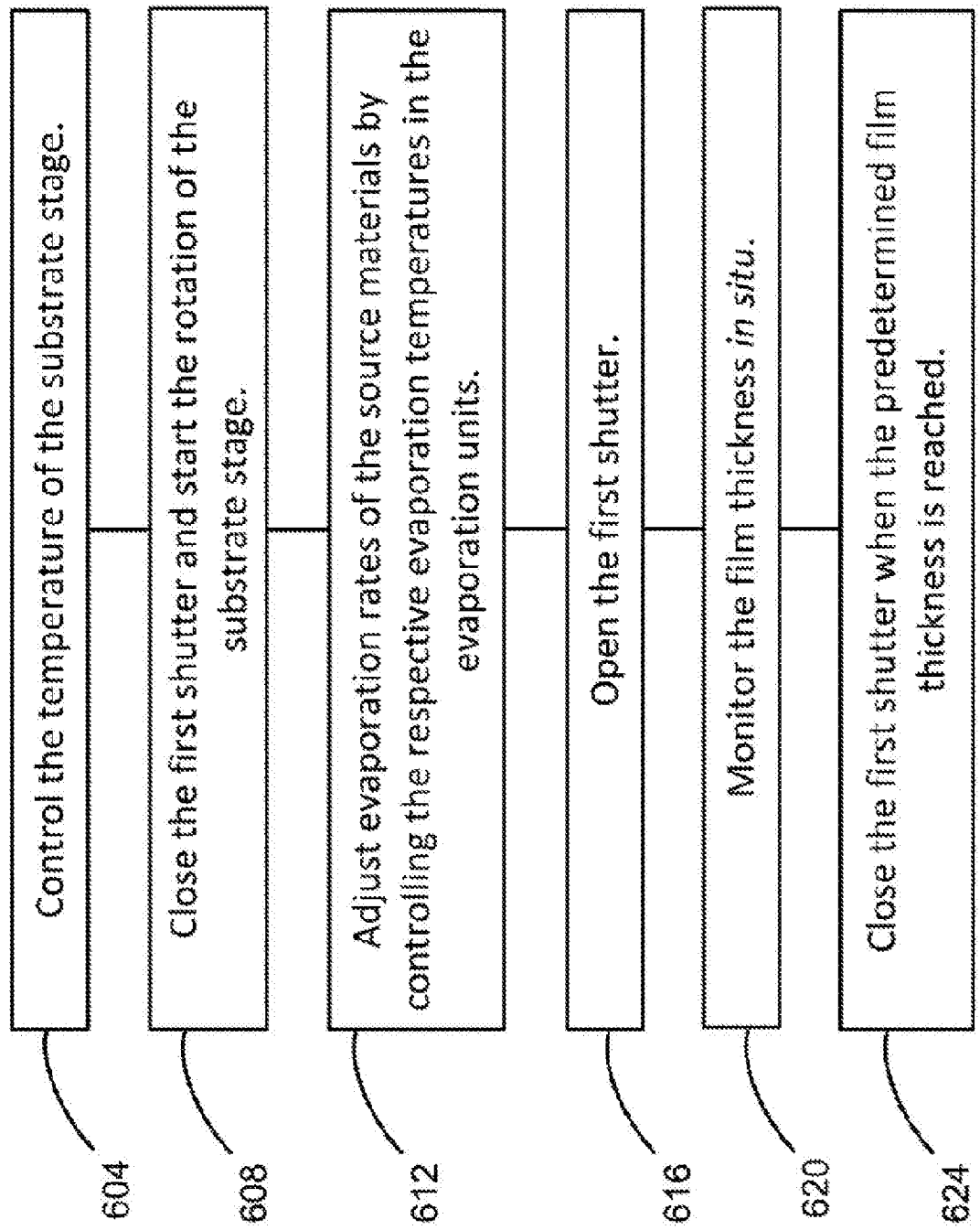
FIG. 6 is a flowchart illustrating an example of the fabrication process of a perovskite film using the present system.

FIG. 6 is a flowchart illustrating an example of the fabrication process of a perovskite film using the present system. This flowchart describes a general case of having $S1_1, S1_2 \ldots$ and $S1_M$ source materials provided in the first set of evaporation units, respectively, each coupled to the side section of the chamber as illustrated in FIG. 2 or to the bottom section of the chamber with a proper shield structure around it, as illustrated in FIG. 5, wherein M≥1 and at least one of the $S1_1, S1_2 \ldots$ and $S1_M$ source materials is the AX compound. In this general case, $S2_1, S2_2 \ldots$ and $S2_N$ source materials are provided in the second set of evaporation units, respectively, coupled to the bottom section of the chamber, wherein N≥2 and at least one of the $S2_1, S2_2 \ldots$ and $S2_N$ source materials is the $BX_2$ compound. The shield is provided to define zones respectively designated for the evaporation units coupled to the bottom section of the chamber. The zones for the second set of evaporation units, containing $S2_1, S2_2 \ldots$ and $S2_N$ source materials, have horizontal cross-sectional areas $A_1, A_2 \ldots$ and $A_N$, respectively, which are open and facing the substrate stage 208/508. As explained earlier, a top shield portion, such as 525 in FIG. 5, may be provided above each of the evaporation units in the first set coupled to the bottom section of the chamber. Alternatively, a chimney-like structure having a shape such as a cylinder, a funnel, etc. may be configured to shield each evaporation unit from the others coupled to the bottom section of the chamber. In this case, the opening portion of the shield structure for each of the evaporation units in the first set may be oriented to face away from the substrate stage. Additionally or alternatively, each of the evaporation units in the first set may be placed horizontally away from the evaporation units in the second set, so as to avoid the overlap between the horizontal cross-sectional area of the substrate stage and that of each of the evaporation units in the first set coupled to the bottom section. Yet alternatively, all the evaporation units in the first set may be coupled to the side section of the chamber, as illustrated in FIG. 2. One or more substrates, collectively called a substrate in this document, are placed on the substrate stage 208/508 facing downward. Examples of substrate materials include: fluorine-dope tin oxide (FTO) glass with electron collection layer (ECL) such as $TiO_2$ compact layer or ZnO thin film; indium tin oxide (ITO) glass with hole collection layer (HCL) such as PEDOT:PSS and NiO, where PEDOT:PSS stands for poly(3,4-ethylenedioxythiophene) polystyrene sulfonate; flexible substrate, such as polyethylene terephthalate, with either ECL or HCL.

The inside of the chamber 200/500 is pumped to a predetermined vacuum level by using the pump unit 204/504. The substrate temperature, the evaporation temperatures for heating the source materials in the evaporation units to provide intended evaporation rates, respectively, the rotation speed of the substrate stage 208/508, the zone area distribution $A_1, A_2 \ldots$ and $A_N$, the intended film thickness, and other growth parameters can be predetermined before the deposition starts and/or can be adjusted during the deposition. The evaporation shutters, such as 236 in FIG. 2, may be provided respectively for the evaporation units in the second set and can be adjusted before and/or during the multi-source deposition. Each evaporation shutter can be opened/closed for quick switching on/off of the vertical transfer of the vapor during the deposition. Similarly, the evaporation shutter, such as 320 in FIG. 3A or 340 in FIG. 3B, provided for the evaporation unit in the first set can be adjusted before and/or during the multi-source deposition.

In step 604 of FIG. 6, the temperature of the substrate stage 208/508 is controlled to provide the predetermined substrate temperature. The temperature of the substrate stage 208/508 can be controlled to provide uniform cooling or heating to the substrate, ranging from −10° C. up to 350° C., for example. In step 608, the shutter 228/528, which is provided just below the substrate stage 208/508, is closed to cover the substrate. The rotation of the substrate stage 208/508 can be started. In step 612, the evaporation rates of the source materials are adjusted by controlling the evaporation temperatures in the evaporation units, respectively. For example, the crucible 404 in FIG. 4A can be heated by the heating element 412 of the evaporation unit 220 in the second set to the temperature that generates the $BX_2$ vapor at the predetermined evaporation rate; the crucible 308 in FIG. 3A can be heated by the heating element 316 of the evaporation unit 216 in the first set to the temperature that generates the AX vapor at the predetermined evaporation rate. When a cell evaporator such as the example in FIG. 3A is used for the AX source, it is preferable, for enhancing the uniformity of the resultant perovskite film, that the evaporation shutter 320 is adjusted to be at a position, which allows for the AX vapor to output from the evaporator efficiently and yet prevents the AX vapor from directly hitting the substrate during deposition. The pump unit 204/504 is coupled to the side section of the chamber 200/500 so as to have the pumping direction substantially along the horizontal direction. This configuration allows for the flow of the AX vapor to circulate in the chamber 200/500 effectively so as to facilitate the chemical-reaction type of deposition on the substrate. In step 616, the shutter 228/528, which is provided just below the substrate stage 208/508, is opened to start the deposition. In step 620, the thickness of the perovskite film growing on the substrate is monitored in situ by using at least one of the monitors provided near the evaporation units, respectively. The deposition rate and the film thickness in situ can be estimated based on the monitored evaporation rate using the tooling factor calculation, for example. In this calculation, the ratio between the measured film thickness and the indicated film thickness (as indicated by the monitored evaporation rate) is obtained during a trial run; thereafter, the ratio can be used to obtain the in situ film thickness by factoring in the evaporation rate during deposition as observed by the monitor. In step 624, when the film thickness reaches the predetermined thickness, the shutter 228/528 is closed to interrupt the deposition.

Figure 7:
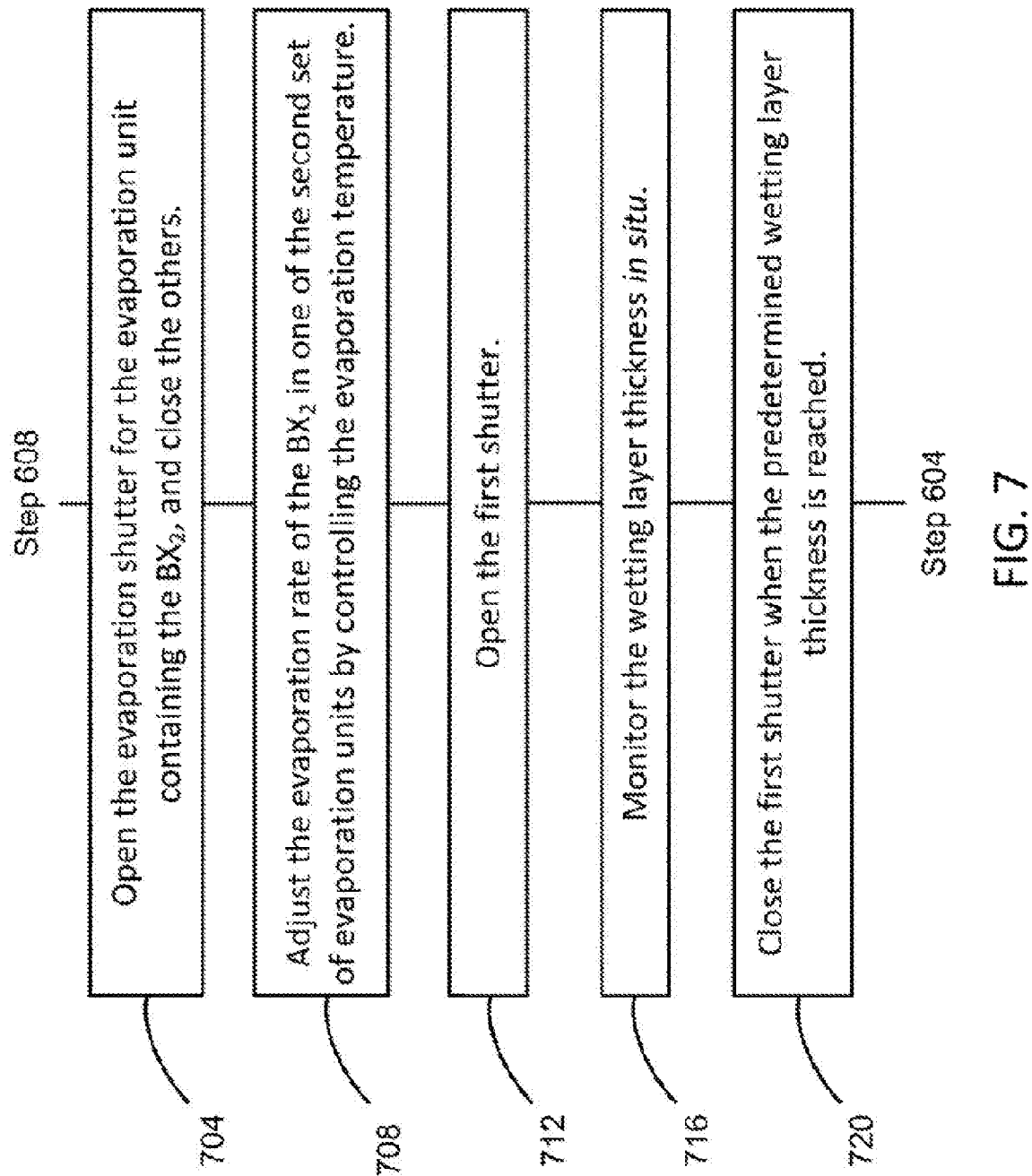
FIG. 7 is a flowchart illustrating an example of a modified process to include the growth of the wetting layer prior to the perovskite film growth using the present system.

The present system and method can be configured to form a wetting layer on the substrate to enhance the quality of the subsequent perovskite film in terms of uniformity and wettability. The wetting layer may be comprised of a metal halide, $BX_2$, where B=Pb or Sn and X=Cl, Br or I, which can be provided in one of the second set of the evaporation units coupled to the bottom section of the chamber 200/500. $PbI_2$ or $PbCl_2$ may be preferably chosen for the wetting layer material. The fabrication process described in the flowchart of FIG. 6 can be modified to accommodate the optional growth of the wetting layer prior to the perovskite film growth. FIG. 7 is a flowchart illustrating an example of a modified process to include the growth of the wetting layer comprising the $BX_2$ prior to the perovskite film growth using the present system. Initially, in step 704, the evaporation shutter for the evaporation unit containing the source material $BX_2$ for the wetting layer is open, whereas the other shutters for the evaporation units containing source materials not needed for forming the wetting layer are closed. This step may be carried out before step 604, between steps 604 and 608, or after step 608 that is the case illustrated in FIG. 7. After the shutter 228/528 is closed and the rotation of the substrate stage 208/508 is started, the evaporation rate of the $BX_2$ in one of the second set of evaporation units is adjusted by controlling the evaporation temperature in step 708. In step 712, the shutter 228/528, which is provided just below the substrate stage 208/508, is opened to start the deposition of the $BX_2$ vapor. In step 716, the thickness of the wetting layer growing on the substrate is monitored in situ by using the monitor provided near the evaporation unit containing the $BX_2$ source material. The tooling factor obtained by the tooling factor calculation may be used to estimate the thickness based on the monitored evaporation rate. In step 720, when the wetting layer thickness reaches the predetermined thickness, the shutter 228/528 is closed to interrupt the deposition of the $BX_2$ vapor. For example, a wetting layer with a thickness of about 50 nm may be formed prior to forming a subsequent perovskite film with a thickness of 200 nm. The deposition of the perovskite film on top of the wetting layer may follow by carrying out step 604 and the subsequent steps.

Figure 8:
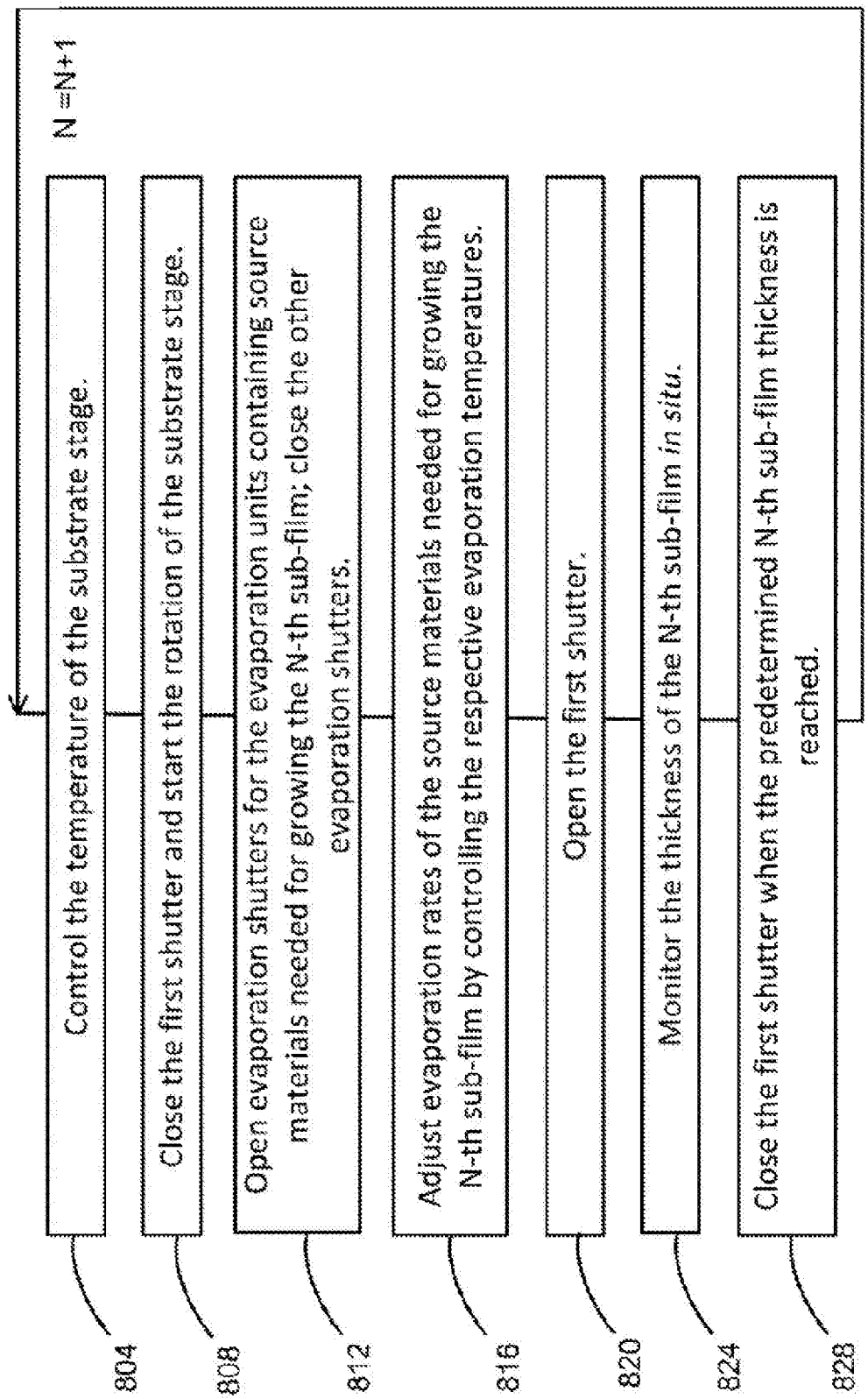
FIG. 8 is a flowchart illustrating an example of the fabrication process of a perovskite heterostructure using the present system.

The present system and method can be configured to fabricate perovskite heterostructures having multiple sub-films, as in Example 5, for forming a Tandem or multi junction structure or for bandgap engineering. One-station process can be configured by preparing all the source materials needed for forming different sub-films, and adjusting the evaporation rates of the needed source materials for each sub-film growth by controlling the corresponding evaporation temperatures while closing the evaporation shutters provided for the evaporation units containing source materials not needed for forming the particular sub-film. FIG. 8 is a flowchart illustrating an example of the fabrication process of a perovskite heterostructure using the present system. Two or more different perovskite sub-films can be fabricated sequentially by repeating steps 804-828 in FIG. 8. In step 804 of FIG. 8, the temperature of the substrate stage 208/508 is controlled to provide the predetermined substrate temperature. In step 808, the shutter 228/528, which is provided just below the substrate stage 208/508, is closed to cover the substrate. The rotation of the substrate stage 208/508 can be started. For forming the N-th sub-film having the N-th type of perovskite material, the evaporation shutters for the evaporation units containing the source materials needed for the N-th sub-film growth are opened, while the other evaporation shutters are closed in step 812. This step may be carried out before step 804, between steps 804 and 808, or after step 808 that is the case illustrated in FIG. 8. In step 816, the evaporation rates of the source materials needed for forming the N-th sub-film are adjusted by controlling the respective evaporation temperatures associated with the evaporation units. In step 820, the shutter 228/528, which is provided just below the substrate stage 208/508, is opened to start the deposition. In step 824, the thickness of the N-th sub-film growing on the previous N−1 sub-film or on the substrate is monitored in situ by using at least one of the monitors provided respectively near the evaporation units generating the vapor sources needed for forming the N-th sub-film. In step 828, when the N-th sub-film thickness reaches the predetermined thickness, the shutter 228/528 is closed to interrupt the deposition.

In any of the fabrication processes based on the present system and method, such as those exemplified in FIG. 6-8, the order of some of the steps may be changed, combined or separated for ease and convenience of carrying out the process. For example, in FIG. 6, controlling the temperature of the substrate stage in step 604 and closing the shutter 228/528 in step 608 may be reversed in order. In another example, starting the rotation of the substrate stage 208/508 may be delayed until just prior to opening the shutter 228/528. Additionally, each of the evaporation shutters for the evaporation units may be opened, closed or adjusted to a certain position before and/or during the deposition depending on the in situ conditions to optimize the growth quality.

Figure 9:
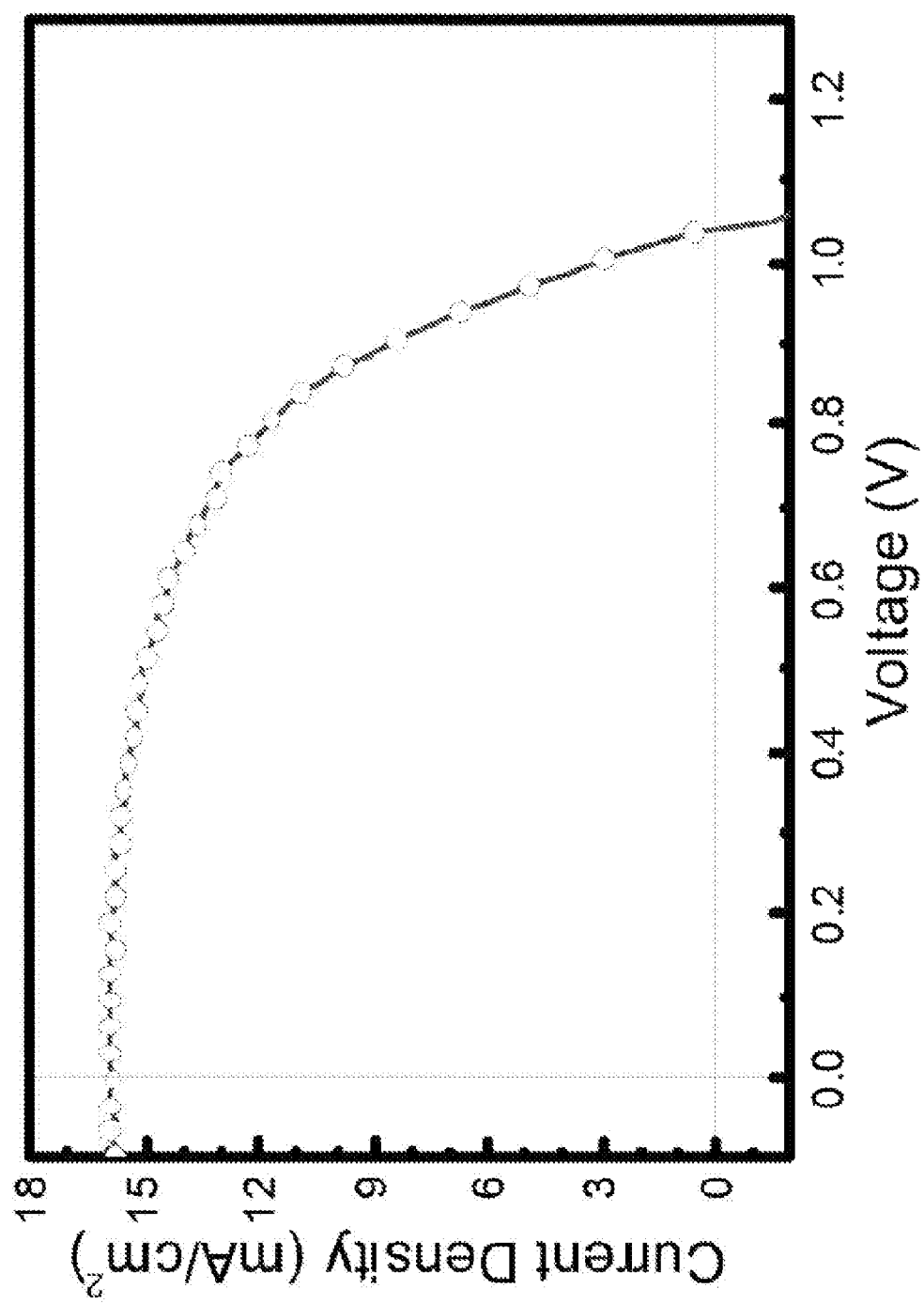
FIG. 9 is a plot of the J-V curve representing the photovoltaic device characterization of a solar cell including the chloride iodide perovskite film, $CH_3NH_3PbI_{3-X}Cl_X$ film, grown by the present fabrication system and method.

FIG. 9 is a plot of the J-V curve representing the photovoltaic device characterization of a solar cell including the chloride iodide perovskite film, $CH_3NH_3PbI_{3-x}Cl_x$ film, grown by using the present fabrication system and method as illustrated in FIG. 2. The system included two evaporation units coupled to the bottom section of the chamber 200, in which the PbI$_2$ and PbCl$_2$ compounds were provided to generate respective vapor sources in two zones defined by the shield 224; one evaporation unit coupled to the side section of the chamber 200, in which the MAI compound was provided to generate its vapor. The TiO$_2$/FTO substrate was used for the present deposition. The perovskite film was grown up to a thickness of about 200 nm on top of the PbI$_2$ wetting layer with a thickness of about 50 nm. The measurements of the J-V curve were carried out under a simulated AM1.5G solar irradiation of 100 mW/cm$^2$. This plot shows that the short circuit current density (Jsc) is 15.9 mA/cm$^2$, the open circuit voltage (Voc) is 1.04V, and the fill factor (FF) is 0.582. This sample has the power conversion efficiency (PCE) of about 9.6%. All solar cells from the same batch deposition showed the similar performance, thereby indicating a device yield of 100%.

Figure 10:
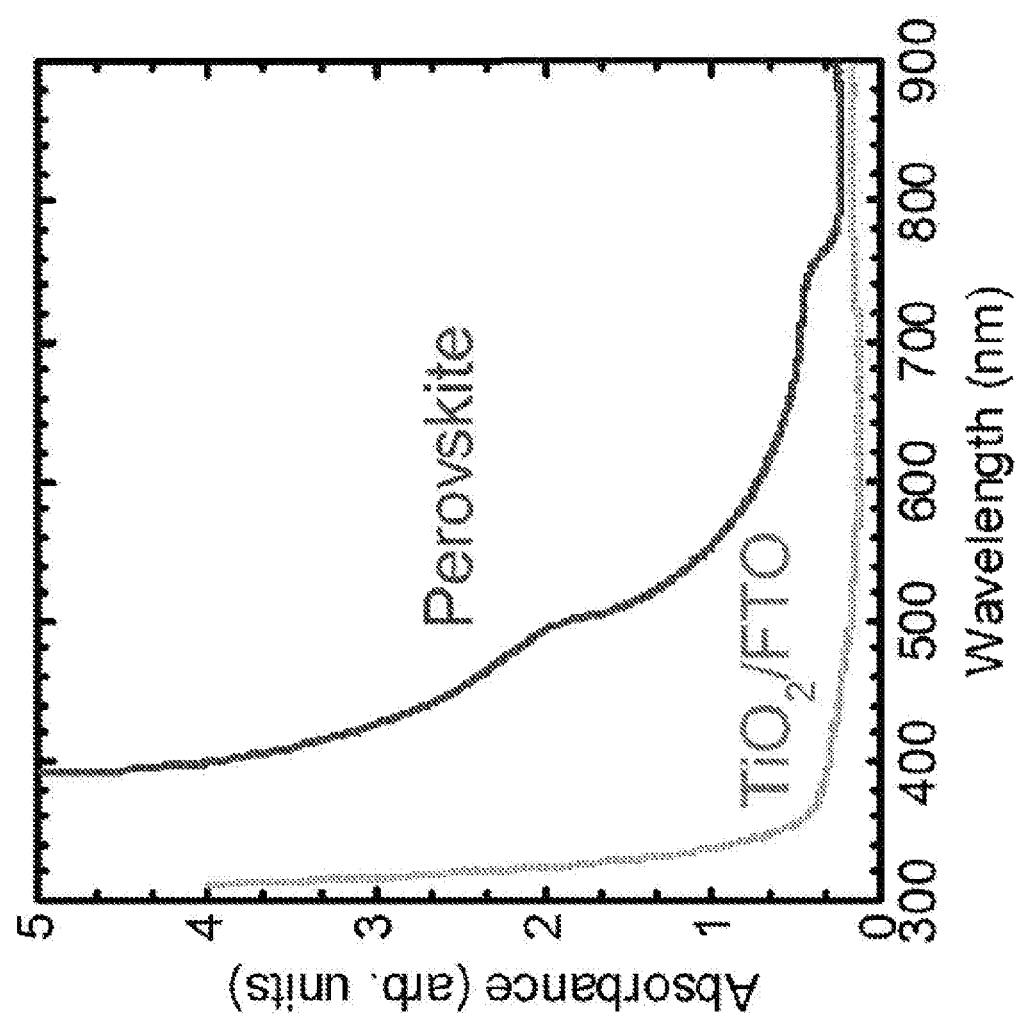
FIG. 10 is a plot of the measured absorbance of the $CH_3NH_3PbI_{3-X}Cl_X$ film.

FIG. 10 is a plot of the measured absorbance of the CH$_3$NH$_3$PbI$_{3-X}$Cl$_X$ film. The sharp rise observed at ~780 nm corresponds to a bandgap of 1.59 eV. The second onset at ~500 nm also is considered to correspond to the intrinsic absorption of a perovskite material.

Figures 11A, 11B:
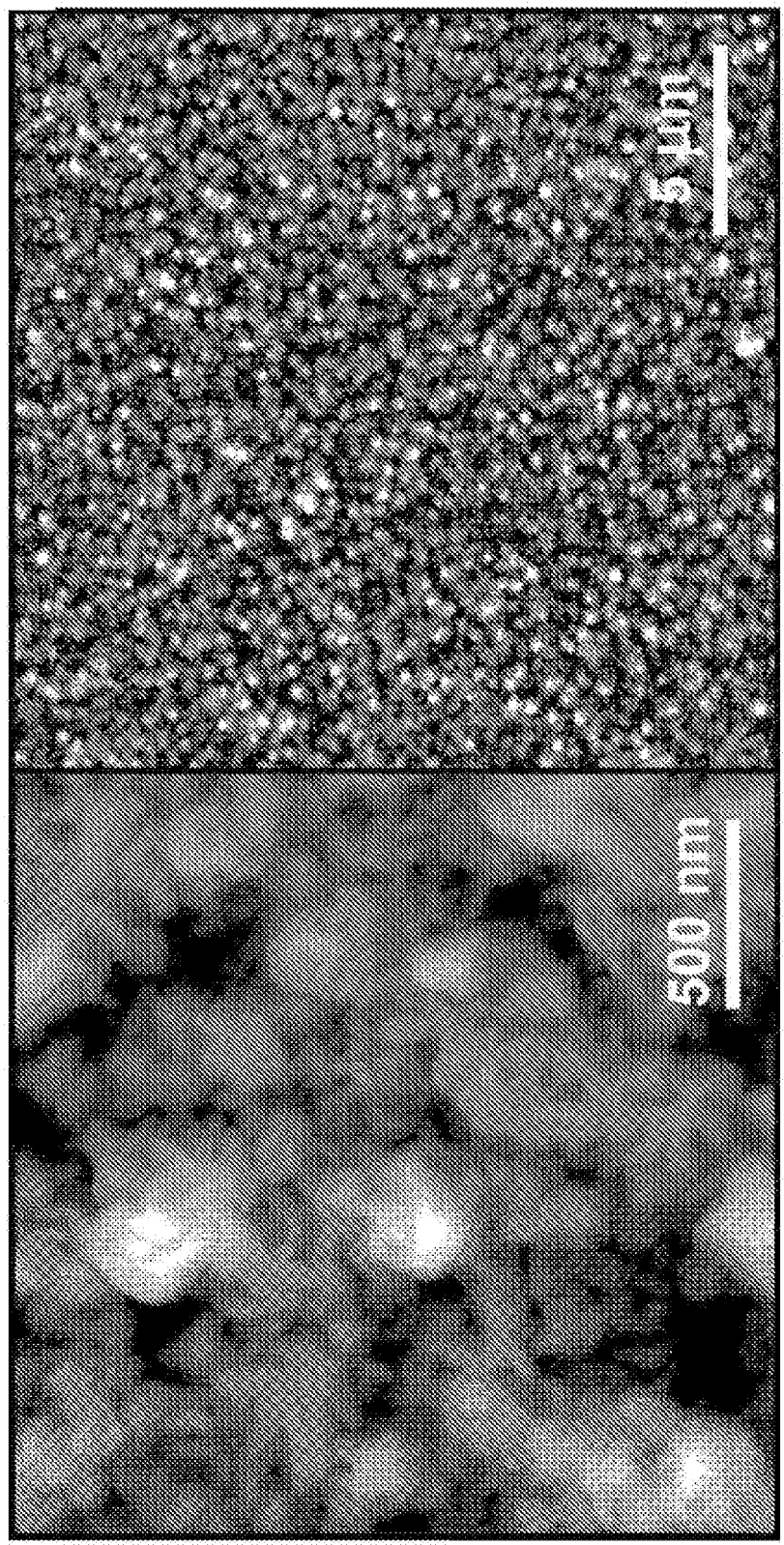
FIGS. 11A and 11B are photos showing the atomic force microscopy (AFM) images of the $CH_3NH_3PbI_{3-X}Cl_X$ film.

FIG. 11 is a photo showing the atomic force microscopy (AFM) images of the CH$_3$NH$_3$PbI$_{3-X}$Cl$_X$ film. Images with scan sizes of 2×2 μm$^2$ and 20×20 μm$^2$ are shown in (A) and (B), respectively. The AFM images show that the typical root-mean square (RMS) roughness of the film is about 37 nm, which is considered to be small, thereby indicating the uniformity of the perovskite film grown by the present fabrication system and method. Perovskite film thickness was determined to be approximately 200 nm by measuring the edge between perovskite film and bare substrate covered by a shadow mask (i.e. a half of the substrate is covered).

Figure 12:
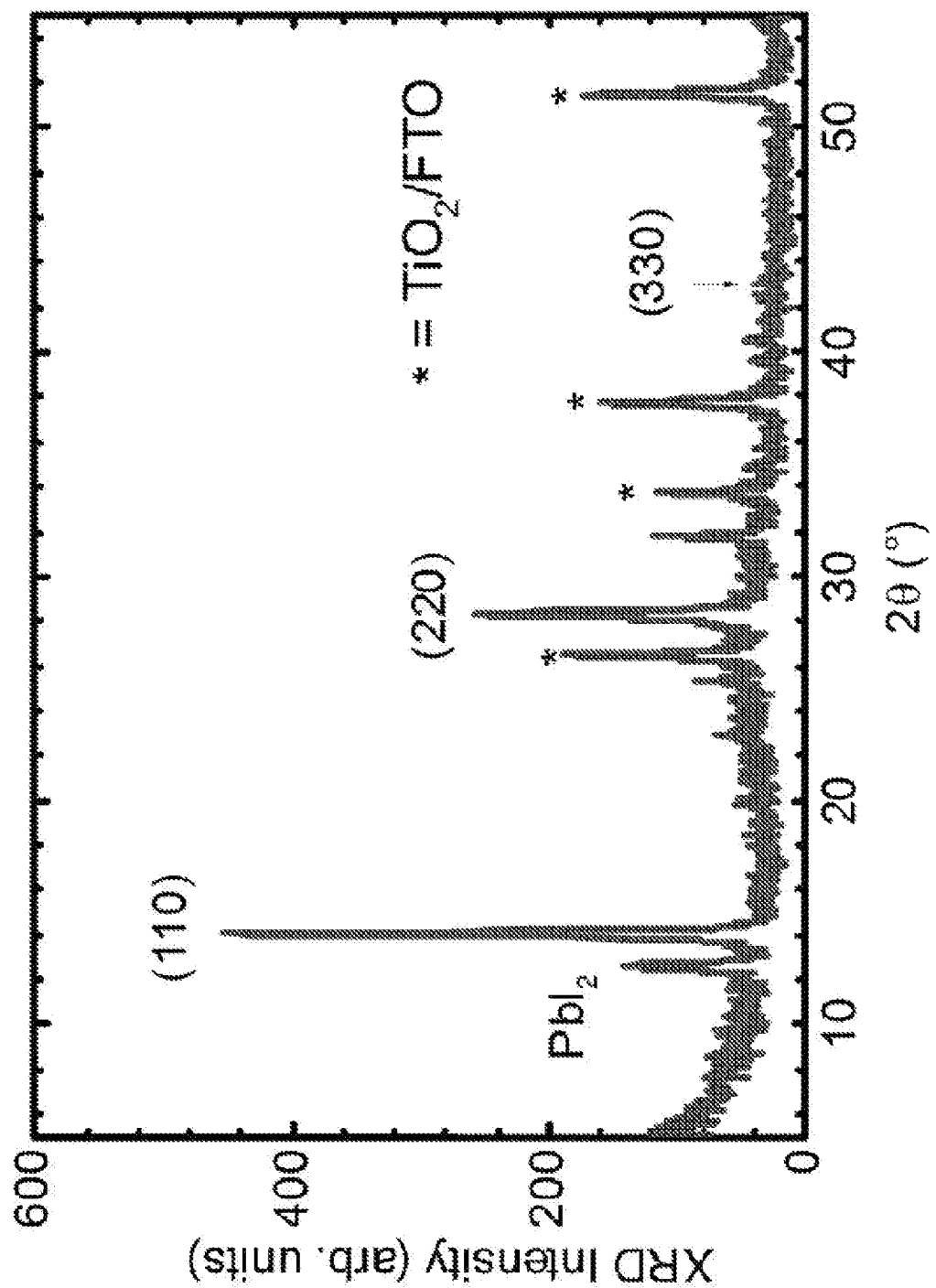
FIG. 12 is a plot showing the X-ray diffraction (XRD) spectrum of the $CH_3NH_3PbI_{3-X}Cl_X$ film.

FIG. 12 is a plot showing the X-ray diffraction (XRD) spectrum of the CH$_3$NH$_3$PbI$_{3-X}$Cl$_X$ film exhibiting the maximum PCE of 9.6% as shown in FIG. 9. This XRD spectrum shows the organometal halide perovskite characteristics having peaks at 14.04, 28.42 and 43.08 degrees corresponding to the (110), (220) and (330) planes of the orthorhombic structure. It should be noted that the peak (110) is stronger than the (220) peak even in the absence of annealing in the present process. The peak labeled with PbI$_2$ is considered to originate from the PbI$_2$ wetting layer.

Figures 13A, 13B:
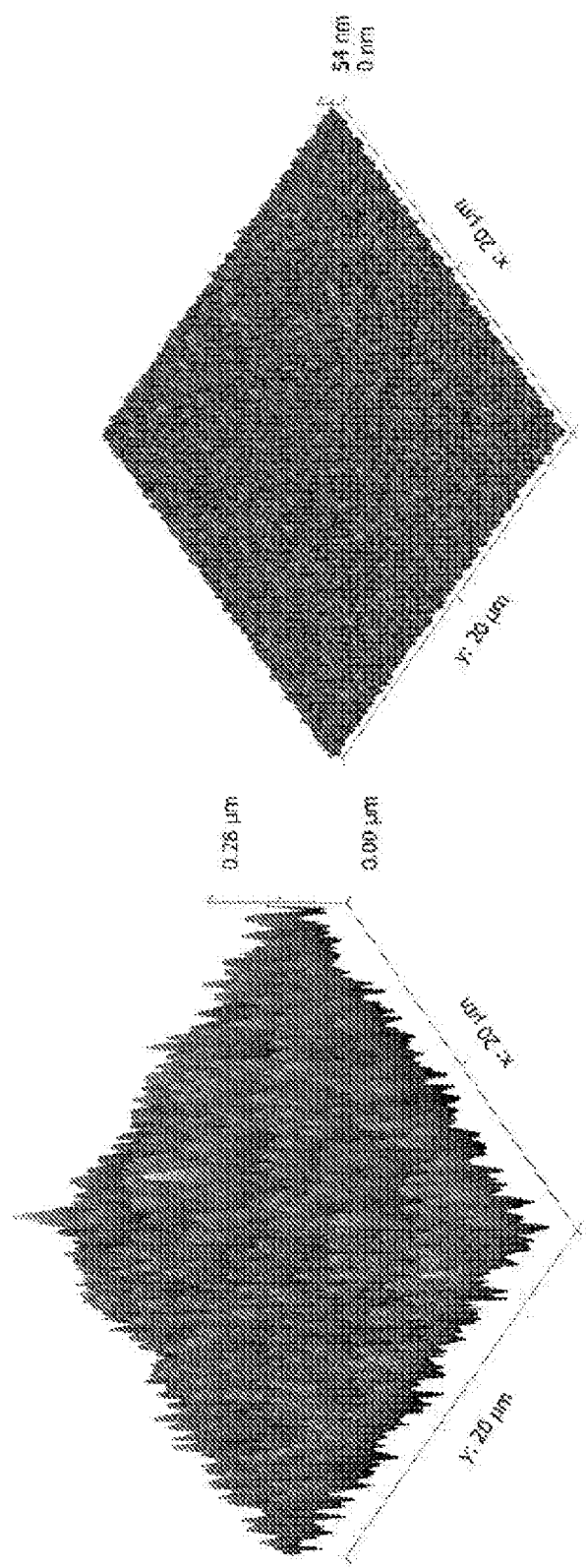
FIGS. 13A and 13B are photos showing the AFM images of the structure of Si/100 nm perovskite/50 nm spiro-MeOTAD, and the AFM image of the structure of Si/10 nm $PbCl_2$/100 nm perovskite/50 nm spiro-MeOTAD, respectively.

FIG. 13 is a photo showing the AFM images of the structure of Si/100 nm perovskite/50 nm spiro-MeOTAD in (A) and the AFM image of the structure of Si/10 nm PbCl$_2$/100 nm perovskite/50 nm spiro-MeOTAD in (B), where the height scales are the same in (A) and (B). These two images compare the effect of adding a wetting layer prior to the perovskite film growth. PbCl$_2$ is used to form the wetting layer on the Si substrate in (B), whereas no wetting layer is included in the structure in (A). spiro-MeOTAD is an organic semiconductor and usually forms an amorphous film that is conformal to the film underneath. For example, when deposited on a typical Si substrate that is very flat, the spiro-MeOTAD film exhibits a roughness of about 0.1-0.2 nm. That is, the morphology roughness of the perovskite film can be observed in the AFM image of the structure capped with spiro-MeOTAD. Comparison between the AFM images in (A) and (B) reveals that significant improvement in film smoothness was achieved by the addition of the PbCl$_2$ wetting layer of about 10 nm in thickness in this example. Subsequent experiments indicated that adding the PbCl$_2$ wetting layer or the PbI$_2$ layer gives rise to similar effects in terms of improving the film smoothness of the perovskite.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be exercised from the combination, and the claimed combination may be directed to a subcombination or a variation of a subcombination.

The invention claimed is:

1. A method for fabricating a perovskite film, comprising:
   placing a substrate on a substrate stage in a chamber, the chamber having a closed hollow structure that has a side section along a vertical direction and top and bottom sections along a horizontal direction, the substrate stage being coupled to the top section of the chamber and configured to have a stage surface facing vertically downward for the substrate to be placed and to rotate around a central axis at a rotation speed;
   depositing first source materials on the substrate from a first set of evaporation units comprising one or more evaporation units, each coupled to the side section or to the bottom section of the chamber, the first set of evaporation units generating vapors of one or more of the first source materials with one or more first evaporation rates, respectively, and deposition of each of the one or more first source materials includes circulating the vapor of the first source material in the chamber, wherein at least one of the one or more first source materials is AX;
   depositing second source materials on the substrate from a second set of evaporation units comprising two or more evaporation units coupled to the bottom section of the chamber, the second set of evaporation units generating vapors of two or more second source materials with two or more second evaporation rates, respectively, and deposition of each of the two or more second source materials includes vertical line-of-sight transfer, wherein at least one of the two or more second source materials is BX$_2$; and
   wherein AX is an organic halide compound and BX$_2$ is a metal halide compound, wherein halogen X in the AX and halogen X in the BX$_2$ are the same or different,
   wherein the chamber includes a shield for separating the two or more evaporation units coupled to the bottom section of the chamber, and thereby defining two or more zones designated for the two or more evaporation units coupled to the bottom section, respectively, wherein the zone designated for each of the two or more evaporation units in the second set is configured to have a horizontal cross-sectional area that is open and facing the substrate surface.

2. The method of claim 1, wherein
   at least the one or more first evaporation rates, the two or more second evaporation rates, the rotation speed and the two or more horizontal cross-sectional areas are adjusted to control composition and thickness of a unit layer to fabricate the perovskite film comprising a plurality of unit layers, wherein each unit layer is formed by one rotation of the substrate stage.

3. The method of claim 2, wherein
the two or more second source materials are two or more metal halide compounds each represented by the $BX_2$, respectively,
wherein at least the one or more first evaporation rates, the two or more second evaporation rates, the rotation speed and the two or more horizontal cross-sectional areas are adjusted to form two or more sub-layers in the unit layer, the two or more sub-layers including at least elements of the two or more types metal halide compounds each represented by the $BX_2$, respectively.

4. The method of claim 2, wherein
one of the two or more second source materials is a dopant material,
wherein at least the one or more first evaporation rates, the two or more second evaporation rates, the rotation speed and the two or more horizontal cross-sectional areas are adjusted to form the unit layer with a predetermined dopant concentration.

5. The method of claim 2, wherein
one of the one or more first source materials is a dopant material,
wherein at least the one or more first evaporation rates, the two or more second evaporation rates, the rotation speed and the two or more horizontal cross-sectional areas are adjusted to form the unit layer with a predetermined dopant concentration.

6. The method of claim 1, wherein
at least one of the one or more evaporation units in the first set is coupled to the side section of the chamber.

7. The method of claim 1, wherein
at least one of the one or more evaporation units in the first set is coupled to the bottom section of the chamber, and
the shield is configured to include a top shield portion above the at least one of the one or more evaporation units in the first set to promote the circulation of the vapor of the first source material therefrom by reducing the vapor directly hitting the substrate.

8. The method of claim 1, wherein
at least one of the one or more evaporation units in the first set is coupled to the bottom section of the chamber, and
an opening portion of the shield for the at least one of the one or more evaporation units in the first set is oriented to face away from the substrate surface to promote the circulation of the vapor of the first source material therefrom by reducing the vapor directly hitting the substrate.

9. The method of claim 1, wherein
at least one of the one or more evaporation units in the first set is coupled to the bottom section of the chamber away from the two or more evaporation units in the second set to avoid an overlap between a horizontal cross-sectional area of the substrate surface and that of the at least one of the one or more evaporation units in the first set.

10. The method of claim 1, further comprising:
controlling a temperature of the substrate stage for providing uniform cooling or heating to the substrate;
rotating the substrate stage at the rotation speed;
controlling temperatures associated with the one or more evaporation units in the first set and the two or more evaporation units in the second set to adjust the one or more first evaporation rates and the two or more second evaporation rates, respectively;
monitoring a film thickness in situ; and
interrupting the deposition when the film thickness reaches a predetermined thickness.

11. The method of claim 10, further comprising:
predetermining at least the one or more first evaporation rates, the two or more second evaporation rates, the rotation speed and the two or more horizontal cross-sectional areas to control composition and thickness of a unit layer to fabricate the perovskite film comprising a plurality of unit layers, wherein each unit layer is formed by one rotation of the substrate stage.

12. The method of claim 10, wherein the chamber further comprises a shutter provided below the substrate stage, and a plurality of evaporation shutters provided for the one or more evaporation units in the first set and for the two or more evaporation units in the second set, respectively, the method further comprising:
closing the shutter to cover the substrate stage before the deposition;
opening the shutter to expose the substrate stage to start the deposition; and
adjusting the plurality of evaporation shutters to control flows of the vapors of the first and second source materials, respectively,
wherein the interrupting the deposition comprises closing the shutter.

13. The method of claim 10, wherein a root mean square roughness per atomic force microscopy (AFM) of the perovskite film fabricated is less than 40 nm without annealing.

14. The method of claim 1, wherein the A is an organic element selected from a group consisting of methylammonium (MA) and formamidinium (FA), the B is a metal element selected from a group consisting of Pb and Sn, and the X is a halogen element selected from a group consisting of Cl, I and Br.

* * * * *